United States Patent
Ingram et al.

(10) Patent No.: US 10,064,312 B1
(45) Date of Patent: Aug. 28, 2018

(54) PURGE-RESILIENT AIR CIRCULATION CONTROL

(71) Applicant: Amazon Technologies, Inc., Reno, NV (US)

(72) Inventors: Cody Daniel Ingram, Kennewick, WA (US); Matthew Thomas Phillips, Bainbridge Island, WA (US)

(73) Assignee: Amazon Technologies, Inc., Reno, NV (US)

( * ) Notice: Subject to any disclaimer, the term of this patent is extended or adjusted under 35 U.S.C. 154(b) by 910 days.

(21) Appl. No.: 14/307,298

(22) Filed: Jun. 17, 2014

(51) Int. Cl.
 *H05K 7/20* (2006.01)
(52) U.S. Cl.
 CPC .............. *H05K 7/20718* (2013.01)
(58) Field of Classification Search
 CPC ....... B32B 1/08; F16L 11/04; F16L 2011/047; B21F 1/00; B21F 1/008; B21F 23/005; B23Q 1/58; B23Q 7/02; F24F 11/0017; F24F 11/0079; F24F 11/02; F24F 11/027; F24F 11/0002; F24F 2221/14; F24F 2221/44; F24F 3/044; F24F 3/16; F24F 6/00; Y02B 30/746; Y02B 30/767; Y02B 30/78
 USPC ................. 340/539.1, 539.26, 628, 630, 632
 See application file for complete search history.

(56) References Cited

U.S. PATENT DOCUMENTS

| | | | | |
|---|---|---|---|---|
| 5,568,377 A | * | 10/1996 | Seem .................. | G05B 13/024 700/28 |
| 2008/0273306 A1 | * | 11/2008 | Campbell .......... | H05K 7/20745 361/698 |
| 2013/0324026 A1 | * | 12/2013 | Fiorita, Jr. ............. | F24F 3/161 454/187 |
| 2014/0320092 A1 | * | 10/2014 | Radan ................... | B63H 23/24 322/19 |

OTHER PUBLICATIONS

"PID for Dummies", Control Solutions, Inc. Minnesota, accessed May 21, 2014, pp. 1-7.

\* cited by examiner

*Primary Examiner* — Robert E Fennema
*Assistant Examiner* — Jigneshkumar C Patel
(74) *Attorney, Agent, or Firm* — Robert C. Kowert; Meyertons, Hood, Kivlin, Kowert & Goetzel, P.C.

(57) ABSTRACT

A data center includes a computer room with one or more regions, where each region includes air handling components which can be independently controlled, relative to components in other regions. A purge control system in each region can bypass a control system which adjusts the components based on environmental sensor data to command the components to purge the region. Upon the components in a region entering a purge mode, a purge notification signal can be sent to a master control system, which can instruct other control systems in other non-purging regions to limit controller output ranges to last-known values prior to the purge, so that the components in other regions are operated at last-known states while one or more regions are purging. When regions have ceased purging, the regional control systems can re-establish the control loop output ranges. Such re-establishment can include incrementally expanding the output range over time.

18 Claims, 10 Drawing Sheets

PURGE-RESILIENT AIR CIRCULATION CONTROL

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many computing racks, which may include server racks. Each computing rack, in turn, may include many computer systems, servers, associated computer equipment, etc.

Electronic components generate waste heat energy when in use. This heat energy should be removed to mitigate a potential for component overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some known computer systems include a plurality of such larger, multiple-processor computers that are configured into rack-mounted components, and then are subsequently positioned within a rack computing system. Some known rack computing systems include 40 such rack-mounted components and such rack computing systems will therefore generate as much as 10 kilowatts of waste heat. Moreover, some known data centers include a plurality of such rack computing systems.

Some known data centers include methods and apparatuses configured to facilitate waste heat removal from a plurality of racking systems. Some data centers rely on forced air systems and air conditioning to maintain the temperatures and other environmental conditions in the data center within acceptable limits. The initial and ongoing costs of installing and operating these systems may add substantial cost and complexity to data center operations.

Some data centers use outside air, also referred to hereinafter and interchangeably as "ambient air", as an important source of cooling air used for waste heat removal. The outside air can be directed to remove heat from equipment in the data center. The outside air can be cooled via one or more various air cooling systems. The characteristics and quality of outside air may vary widely, however, even at a given location.

Some data centers include purge systems which purge an environment in a data center. Such purge systems may command various components in the data center to maximize air circulation through a computer room, including commanding various air handling components to induce a maximum air flow. Such a purging of a data center environment can pose risks for various equipment and control systems in a data center.

Figure 1:
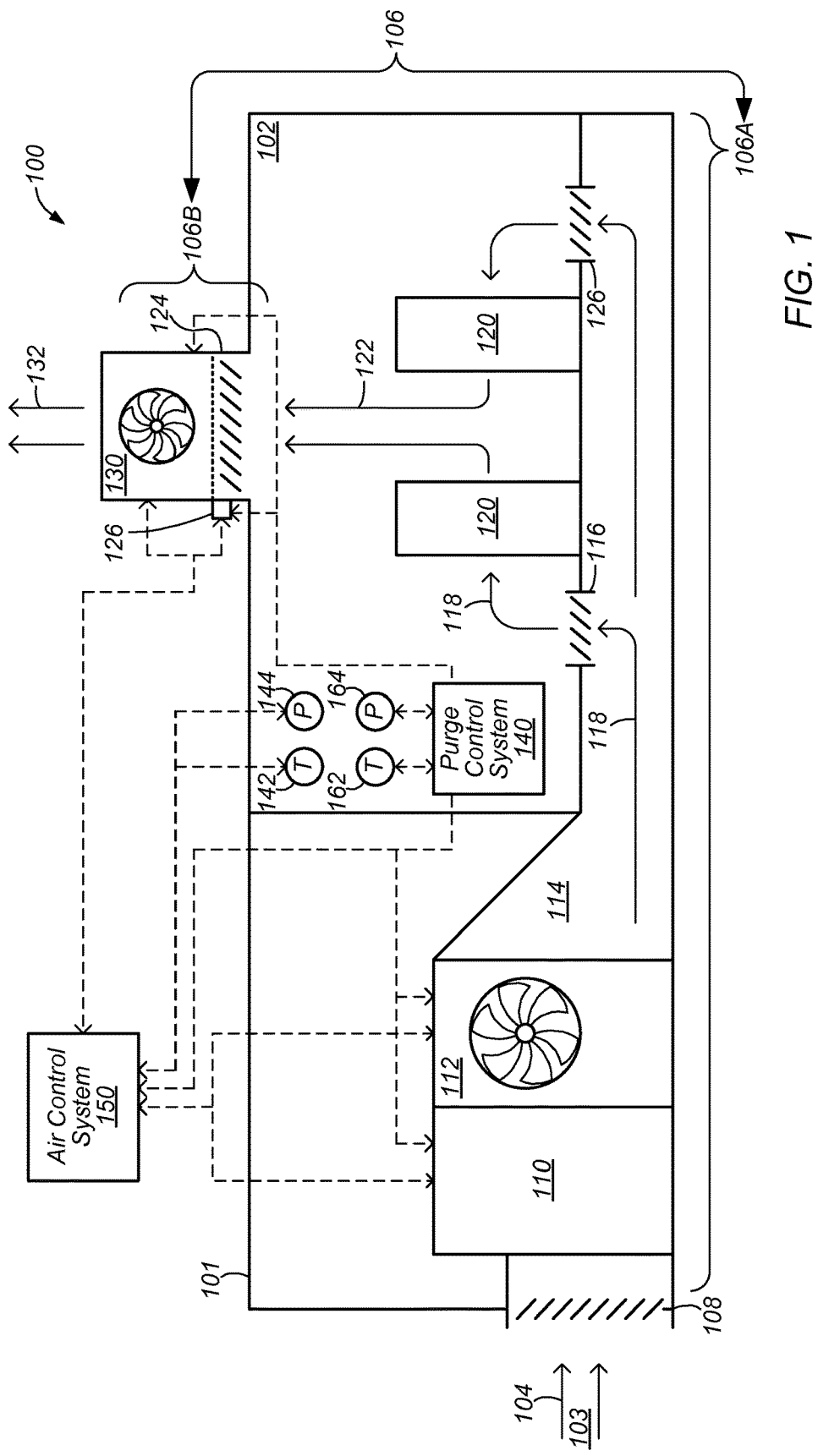
FIG. 1 is a schematic diagram illustrating a view of a data center that includes a computer room, air handling components, and one or more control systems, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of an air circulation system which includes a purge control system which can purge some or all of a computer room and a circulation control system which limits controller outputs during a purge are disclosed. According to one embodiment, a data center includes a computer room and a master control system. The computer room includes multiple regions, and each region includes rack computer systems which perform computing operations, a regional air control system, and a regional purge control system. The regional air control system can adjustably control air circulation in the region via a control loop system, based at least in part upon at least one measured condition of an environment of the region. Adjustably controlling air circulation in the region can include adjustably controlling air supply components to adjustably control a flow rate of cooling air to the plurality of rack computer systems in the region. Adjustably controlling air circulation in the region can include adjustably controlling air removal components to adjustably control a flow rate of exhaust air, discharged by the plurality of rack computer systems, out of the computer room. The regional purge control system can bypass the regional air control system and directly command the air supply components and air removal components in the region to purge the environment of the region. The master control system can respond to a determination that an environment of one of the multiple regions is presently being purged by commanding a regional air control system of another region which is not being purged to, for each of the air supply components and air removal components in the at least one other region restrict a controller output range of the control loop system, for controller outputs to control the respective component. As a result of such restricting, a minimum controller output value and a maximum controller output value of the range both match a value of a last controller output generated prior to the determination. In addition, the master control system can respond to a determination that the at least one of the plurality of regions has ceased being purged by commanding the regional air control system to incrementally decrease the minimum controller output value and increase the maximum controller output value, from the last controller output value, to expand the controller output range to a full controller output range for the respective component.

According to one embodiment, a method includes performing, by a computer system, executing a control loop system to generate controller output signals to control at least one air handling component in a computer room, and limiting a range of signal values of generated controller output signals, based at least in part upon a determination that the air handling component is being commanded, via a bypass of the control loop system, to purge the computer room. The control loop system is executed to generate controller output signals based at least in part upon environmental sensor data associated with the computer room.

According to one embodiment, a non-transitory computer-readable medium stores a program of instructions that, when executed by a computer system, cause the computer system to generate controller output signals to control at least one air handling component in a computer room, and limit a range of signal values of generated controller output signals, based at least in part upon a determination that the air handling component is being commanded, via a bypass of the control loop system, to purge the computer room. The control loop system is executed to generate controller output signals based at least in part upon environmental sensor data associated with the computer room.

As used herein, "air handling system" means a system that provides or moves air to, or removes air from, one or more systems or components. Components in an air handling system, which can be referred to as air handling components, can include air supply components which supply cooling air to a computer room and air removal components which remove exhaust air from the computer room.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, a "chimney effect" or "stack effect" refers to a flow of air through a pathway that is induced by an air density difference between the ends of the pathway. Such a difference may be induced by one or more various factors, including temperature differences between the ends of the pathway, ambient pressure differences, humidity differences, and the like. For example, where a building with a warm enclosure is surrounded by a colder ambient environment, the chimney effect may refer to an induced flow of air through a pathway (e.g., a chimney) between the enclosure and the environment that is induced by an air-density difference between the lower-density warmer air of the enclosure passing through the pathway to the environment while being displaced by the higher-density colder air from the environment.

As used herein, "mechanical cooling" means cooling of air by a process that involves doing mechanical work on at least one fluid, such as occurs in vapor-compression refrigeration systems. Mechanical cooling may include sensible cooling.

As used hereinafter, the terms "cool" and "chill", and variations thereof, are used interchangeably.

As used herein, "direct evaporative cooling" means cooling of air by evaporation of liquid directly into a stream of air to be cooled.

As used herein, "evaporative cooling system" means a system that cools by evaporation of a liquid.

As used herein, "ambient" refers to a condition of outside air at the location of a system or data center. An ambient temperature may be taken, for example, at or near an intake hood of an air handling system.

As used herein, "room" means a room or a space of a building. A "computer room" means a room in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "damper" includes any device or component that can be moved to control (e.g., increase or decrease) the flow of fluid through a duct or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "position" a damper means to place or leave one or more elements of the damper to achieve desired flow characteristics through the damper, such as open, closed, or partially open. In a system with eighteen air handling sub-systems, positioning the outside air dampers may include opening outside air dampers in eight of the sub-systems and keeping outside air dampers closed in the other ten sub-systems.

As used herein, a "module" is a component or a combination of components. A module may include functional elements and systems, such as one or more portions of computer systems, circuit boards, racks, blowers, ducts, and power distribution units, as well as structural elements, such a base, frame, housing, or container.

As used herein, a "rack computer system" means a computer system that includes one or more computing devices mounted in a rack.

FIG. 1 is a schematic diagram illustrating a view of a data center that includes a computer room, air handling components, and one or more control systems, according to some embodiments.

Data center 100 includes a structure 101 which includes a computer room 102 and an air handling system 106 with subsystems 106A-B.

Computer room 102 includes one or more sets of rack computer systems 120 which can perform computing operations to provide computing capacity for the data center 100. Each rack computer system 120 can include one or more computer systems installed in a rack. Each computer system can include one or more heat-producing components, including mass storage devices (e.g., hard disk drives, solid state drives, etc.) processor circuitry, and the like which produce heat during operation. Such heat, also referred to as "waste heat", can induce thermal damage to computer systems if not at least partially removed.

In some embodiments, cooling air is supplied to various rack computer systems in a computer room to remove waste heat from the rack computer systems. Such air is discharged from one or more rack computer systems as "exhaust air", which can be removed from the computer room to remove the waste heat from the computer room. In the illustrated embodiment, cooling air 118 is supplied into computer room 102 via supply dampers 116, and exhaust air 122 discharged from the rack computer systems 120 exits the computer room 102 via an exhaust damper 124.

In some embodiments, a data center includes one or more air handling systems which manage circulation of air through portions of the data center. An air handling system can include an air supply subsystem, which provides cooling air to at least a portion of a computer room, and an air removal subsystem, which removes exhaust air from at least the portion of the computer room. In the illustrated embodiment, air handling system 106 includes air supply subsystem 106A and air removal subsystem 106B. Air supply subsystem 106A supplies cooling air 118 into computer room 102, and air removal subsystem 106B removes exhaust air 112 from the computer room 102.

Air supply subsystem 106A includes intake air dampers 108, air cooling system 110, intake air moving device 112, supply air plenum 114, and supply air dampers 116. Intake air dampers 108 can receive ambient air 104 from an ambient environment 103, which can include an environment outside the data center 100. The ambient air 104 received into the air supply subsystem 106A via the intake air dampers 108 can be cooled by an air cooling system 110, and moved through the air supply subsystem 106A by an intake air moving device 112, to be provided as cooling air 118 to the computer room 102. The air cooling system 110 can include various components, including coolant valves, coolant pumps, damper actuators, etc., which can be adjustably controlled, based at least in part upon various signals received at the air cooling systems, to adjustably control the induced cooling of ambient air 104. For example, a valve position of a coolant circulation valve can be adjustably positioned to control the amount of cooling of ambient air passing through a mechanical cooling system.

Air cooling system 110 can include one or more various air cooling systems which can reduce one or more of a dry bulb temperature, wet bulb temperature, etc. of ambient air 104. Such various air cooling systems can include one or more of a mechanical cooling system, evaporative cooling system, free-cooling system, etc. Intake air moving device 112 can include one or more various air moving devices, including fans, blowers, compressors, etc., which induce an air flow through the air supply subsystem 106A, thereby inducing a flow rate of the cooling air 118. The air moving device can include a drive motor, which can be a variable-frequency drive ("VFD") which can be adjustably controlled to operate at various motor speeds, based at least in part upon various signals received at the air moving device, to adjustably control the induced flow rate of cooling air 118.

Cooling air 118 can circulate through supply air plenum 114 and can be directed from the plenum 114 into the computer room 102 via one or more dampers 116. Such dampers 116 can be adjustably positioned, via operation of damper actuators for each of the dampers based on received signals, to adjustably control the flow rate of cooling air 118 from the plenum 114 into the computer room 102.

In the illustrated embodiment of FIG. 1, the air supply subsystem 106A comprises a raised-floor air cooling system, where cooling air is distributed through a raised floor plenum beneath the computer room 102 and is directed upwards from the plenum 114 into the room 102 via dampers 116 mounted in one or more floor elements, including one or more floor tiles. In some embodiments, the air supply subsystem 106A comprises one or more various cooling system configurations. For example, the plenum 114 can comprise a ductwork assembly, comprising air circulation ductwork, which extends through a portion of computer room 102 and directs air through the ductwork and out of the ductwork, at various locations along the ductwork, via dampers installed in the ductwork. The ductwork assembly can extend through a computer room at an elevated position above a floor element of the computer room, above a maximum height of the rack computer systems 120 in the room 102, etc.

Air removal subsystem 106B includes an exhaust air damper 124 and exhaust air moving device 130. Damper 124 can be adjustably positioned by actuator 126, based at least in part upon signals received at the actuator 126, to adjustably control air flow through the damper 126. In some embodiments, damper 124 can be adjustably positioned to preclude ambient environmental elements, including precipitation, from entering the computer room.

Exhaust air moving device 130 can include one or more various air moving devices which can be adjustably controlled to induce an adjustably controllable flow rate of the exhaust air 122 into the ambient environment 103 as exhaust air flow 132.

In some embodiments, various components in the air handling system 106 can be adjustably controlled to adjustably control air circulation through various portions of the data center. A control system 150 in data center 100 is communicatively coupled to the various components in both air supply subsystem 106A and air removal subsystem 106B and can generate controller output signals to the various components to control operation of the various components. Control system 150 can generate particular controller output signals, for transmission to a particular one of the various components 110, 112, 116, 124, 130, 108, where a controller output signal generated and transmitted to a particular component is a command signal that, when received by the particular component, is executed by apportion of the component to adjustably control operation of the component. For example, an output signal generated for, and transmitted to an exhaust air moving device can include a command to adjust a motor speed of a variable-frequency drive ("VFD") driving a fan in the device 130 to adjust the flow rate of exhaust air 122 out of the computer room 102.

In some embodiments, a data center includes various environmental sensors which measure one or more various conditions of an environment in the data center. Sensor data generated by the sensors based on such measurements can be transmitted to a control system, which uses the sensor data in generating output control signals. In some embodiments, a control system includes a control loop system which generates controller output signals which are adjusted based at least in part upon sensor data received from various environmental sensors. Where an output signal indicates a value associated with a control signal value range of a component to which the output signal is transmitted, the value indicated in the generated signals can be adjusted based at least in part upon sensor data, so that various components in system 106 are adjustably controlled based at least in part on sensor data. As a result, one or more portions of air circulation through the data center can be adjustably controlled based at least in part upon environmental sensor data.

In the illustrated embodiment, data center 100 includes environmental sensors 142, 144. Temperature sensor 142 measures a local temperature of the environment of the computer room 102, and pressure sensor 144 measures a local static pressure of the environment of the computer room 102. Each sensor 142, 144 is communicatively coupled to control system 150 and can transmit sensor data to control system 150. Control system 150 can include a one or more control loop feedback systems, also referred to herein as "control loop systems", which adjust the values indicated in controller output signals generated for transmission to the various components of system 106 based at least in part upon the sensor data received from sensors 142, 144. Control feedback loop systems can include PID controller systems. Control system 150 can include a temperature control loop system and a pressure control loop system, where the controller outputs are adjusted based at least in part upon the temperature and static pressure of the computer room 102.

Where control system 150 includes a temperature control loop system and a pressure control loop system, the control system may adjust the controller output signals of various components to control air circulation through computer room to direct the temperature and static pressure of the computer room towards one or more various set point values. For example, where the control system 150 determines, based on sensor data from pressure sensor 144, that the static pressure in computer room 102 exceeds a threshold set point value, the control system 150 may generate a controller output signal to transmit to exhaust air moving device 130 to control device 130 to increase a flow rate of exhaust air 122 out of the computer room 102 to reduce the static pressure in room 102. In another example, where the control system 150 determines, based on sensor data from temperature sensor 142, that the temperature in computer room 102 exceeds a threshold set point value, the control system 150 may generate a controller output signal to transmit to air cooling system 110 to control system 110 to increase cooling of ambient air 104 to reduce the temperature in room 102. Control system 150 may generate controller output signals for various components in data center 100 continuously, periodically, intermittently, in response to receiving sensor data from one or more various sensors, some combination thereof, or the like.

In some embodiments, a data center includes a purge control system which can cause the environment of some or all of a computer room in the data center to be purged. Purging a computer room environment 102 can include operating various components in the data center to cause the environment in the data center computer room 102 to approach having environmental conditions corresponding to environmental conditions of the ambient environment. For example, where components in system 106 operate to maintain the computer room 102 environment at a "positive pressure"—that is, a greater static pressure than the static pressure of the ambient environment 103 purging the room 102 environment can include commanding various components in system 106 to operate such that the static pressure in the room 102 is equalized with that of the ambient environment.

In some embodiments, purging a computer room environment can include one or more of increasing the flow rate of exhaust air out of a computer room, increasing the flow rate of cooling air into the computer room, increasing the cooling of ambient air received into an air supply subsystem, etc. Purging a computer room environment can be an emergency response to preclude damage to rack computer systems in a computer room, when environmental conditions in the computer room, indicated by one or more conditions, including temperature, pressure, etc., exceed one or more thresholds. In some embodiments, purging a computer room environment includes commanding various air handling components in an air handling system to operate at a maximum operating state, such that the output of the component is maximized. For example, an air moving device operating at a maximum operating state may include a driver motor operating at a maximum operating speed, so that the air flow rate induced by the air moving device is maximized. In another example, a damper operating at a maximum operating state can be positioned in a fully-open position, such that the cross sectional flow area through the damper is maximize. In another example, a cooling system operating at a maximum operating state includes a coolant circulation system, which itself can include various values, pumps, etc., which are adjusted to maximize coolant flow to maximize cooling of air flowing through the cooling system.

In some embodiments, a purge control system is communicatively coupled with the various components in the air handling system and can sent output signals to those components which can bypass the air control system and directly command the air components to purge the computer room. The purge control system, therefore, can generate signals to the components which can override control signals from the air control system. In the illustrated embodiment, for example, purge control system 140 is communicatively coupled to the various components of air handling system 106 and can generate signals to those components which can directly command those components to purge the computer room 102. Commanding components to purge a room can include commanding the components to operate at one or more particular operating states, including a maximum operating state, which causes the room to be purged. In some embodiments, purge control system 140 receives sensor data from sensors 162, 164, and purge control system 140 can determine to command components in system 106 to purge the computer room 102 based at least in part upon sensor data from sensors 162, 164. As shown, the purge control system 140 receives sensor data from a separate set of sensors 162, 164 than the sensors 142, 144 from which the air control system 150, receives sensor data. Such a determination can include a determination that one or more conditions of the environment of room 102, including one or more of temperature, static pressure, etc., exceed one or more predetermined thresholds. For example, system 140 can determine to initiate a purge of computer room 102 via commanding one or more components in system 106 to purge the room 102 based at least in part upon a determination that static pressure exceeds an overpressure threshold pressure value, a determination that room 102 temperature exceeds a predetermined high-temperature threshold, etc. In some embodiments, system 140 initiates a purge based at least in part upon a user-initiated command to purge the room 102. Such a command can be received based at least in part upon an operator interacting with a manual purge button, switch, etc. to command initiation of the purge.

In some embodiments, one or more control loop systems continue to process sensor data to determine controller output signal values during a purging of the computer room. While output signals generated by system 150 may not be transmitted during the purge, may be ignored by components in system 106 during the purge, etc., the control loop systems may continue to process sensor data to generate controller output signals during the purge.

In some embodiments, purge control system 140, upon a determination that the purge is to be ended, initiates a re-set of the purge system, whereby the various components in system 106 that are directly commanded by system 140 during the purge are, based on the above determination, commanded by system 140 to be switched back to executing output signals from control system 150. Such switching can include ceasing to generate and transmit control signals from system 140 to components in system 106, sending a command to the components to resume executing output signals received from control system 150, where the purge system 140 commanding the components to purge may have included a command to the components to ignore output signals received from system 150, etc. A determination that the purge is ended can be based at least in part upon sensor data received at system 140 from various sensors 142, 144, including a determination that one or more environmental conditions have crossed one or more threshold values. The determination can be based at least in part upon a user-initiated re-set command, received based at least in part upon an operator interacting with a "re-set" button, switch, etc. to command a re-set of the purge system.

In some embodiments, switching air handling components of system 106 from being commanded by purge system 140 to being controlled by system 150 can result in air circulation instability in the data center. As noted above, where a control system 150 includes one or more control loop systems, such systems may continue to operate, generating controller output signals based on sensor data, during a purge, although such generated controller output signals may not be executed by the components to which such generated signals may be transmitted during the purge. Upon the ending of a purge, a control loop system may be subject to wide swings in controller output signal values, due to rapid changes in environmental conditions caused by the purge. For example, a purge may result in static pressure and temperature in the computer room 102 dropping significantly in a relatively short amount of time. Control loop systems that generate controller output signals based on temperature control loops and pressure control loops may generate output signals to control various components of system 106 to attempt to compensate for such rapid changes in environmental conditions. Upon the purge ending, the control loops may continue to generate output signals that attempt to control components to compensate for environmental changes during the purge. Furthermore, upon the purge ending, the computer room environment may not stabilize, such that environmental conditions stabilize, for a brief period of time as components in system 106 cease operating in a purge state. As a result, control loop systems may, upon resuming control of air handling system components at the end of a purge, generate output signals with signal values that, when executed by air handling components, cause wide operating state swings in the various air handling components as the control system attempts to reach an equilibrium state based on highly dynamic sensor data (i.e., sensor data with significant value changes over time). Such wide operating state swings can prolong environmental condition instability in the computer room and can pose risks of damage to various air handling equipment of system 106, rack computer systems 120, etc.

In some embodiments, the various air handling components of air handling system 106 and the various control systems 140, 150, sensors 142, 144, etc. are included in a facility that is separate from a data center. For example, computer room 102 can be an enclosure space that is separate from a computer room, where rack computer systems 120 are absent and where the air handling system 106 provides air circulation through the enclosure space 102. In some embodiments, one or more of the control systems 140, 150, is at least partially implemented by one or more computer systems, including a computer system as illustrated below in FIG. 9.

Figure 2A:
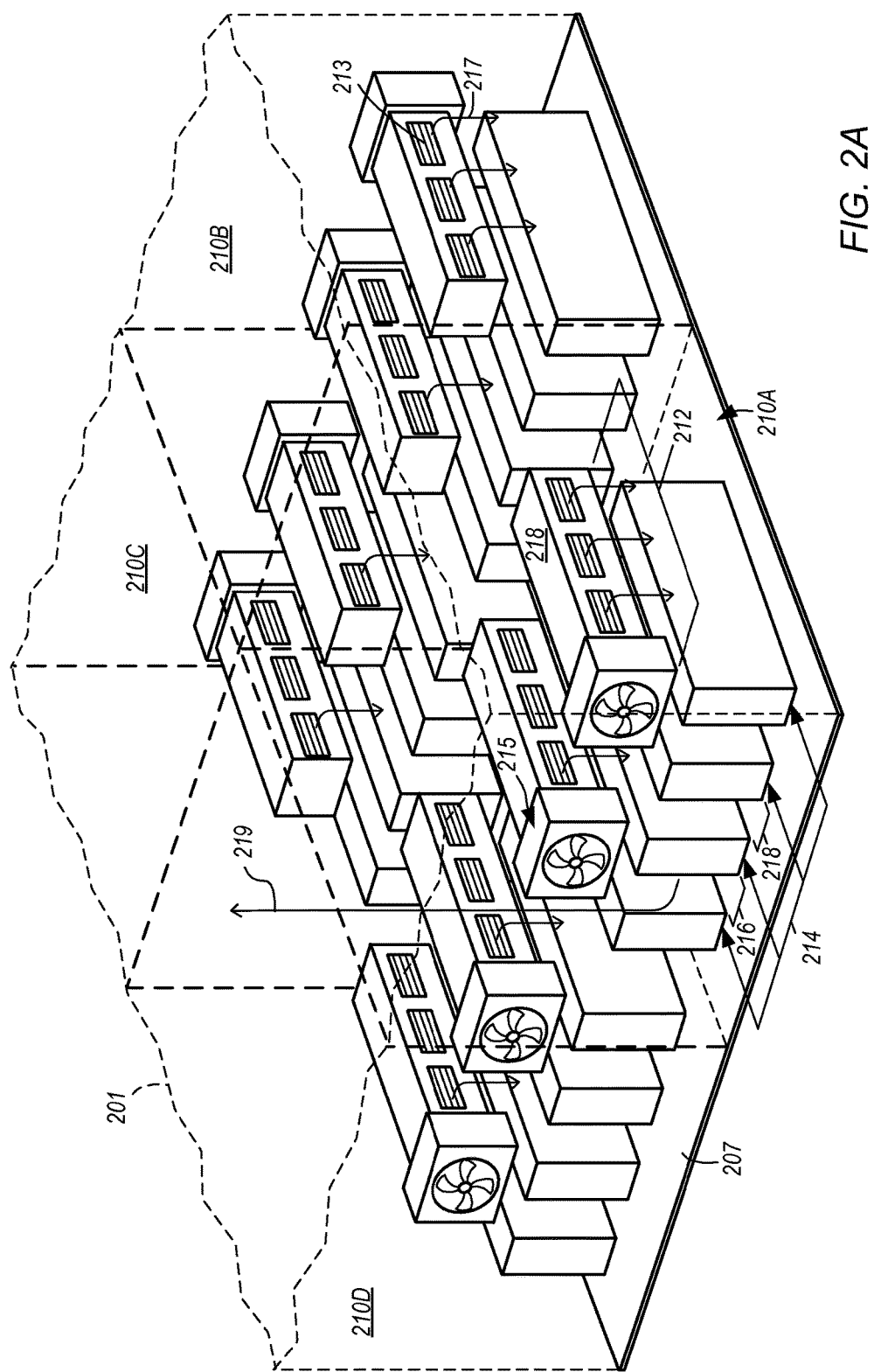
FIG. 2A-B illustrate a perspective view of a computer room that includes multiple regions including separate air handling components, according to some embodiments.
Figure 2B:
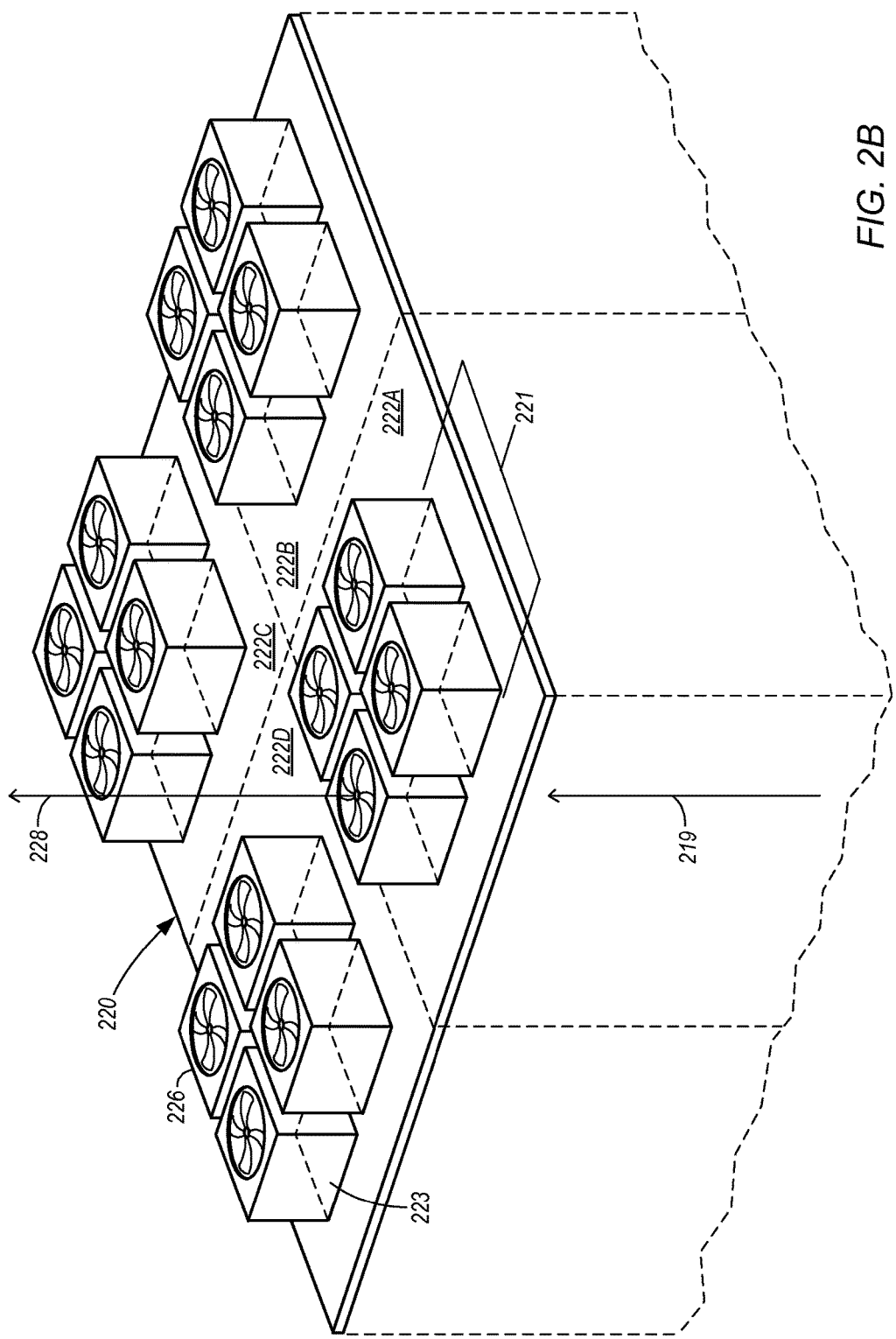

FIG. 2A-B illustrate a perspective view of a computer room that includes multiple regions including separate air handling components, according to some embodiments. FIG. 2A illustrates a lower portion of the computer room which includes various rack computer systems and air supply components in each of multiple various regions. FIG. 2B illustrates an upper portion of the computer room which includes various air removal components included in various portions of a roof structure associated with the separate regions.

In some embodiments, a data center computer room includes multiple regions, where each separate region includes a separate set of air handling components which can be controlled, independently of air handling in other regions, to adjustably control air circulation in the particular region in which the set of air handling components are included.

In the illustrated embodiment of FIG. 2A, for example, data center 200 includes a computer room 201 that itself includes four separate regions 210A-D. Each region 210 includes a separate set of rack computer systems 214, illustrated in FIG. 2A to extend in one or more rows in a particular region, with aisles 216, 218 extending along and between various rows. In some embodiments, cooling air is supplied into certain aisles for supplying to the rack computer systems adjacent to one or more of those aisles. Such aisles are referred to as "cold aisles". In some embodiments, exhaust air is discharged from rack computer systems into one or more spaces adjacent to the rack computer systems. Such a space can include an aisle extending along a row of rack computer systems, which may be referred to as a "hot aisle". In FIG. 2A, each region 210 includes cold aisles 216 and hot aisles 218. Cooling air can be supplied into cold aisles 216 and can be supplied from cold aisles 216 into one or more rack computer systems 214, while exhaust air can be discharged from the rack computer systems 214 into one or more hot aisles 218.

In some embodiments, each region includes an independent set of air handling components. In FIG. 2A, for example, each region includes a separate set of air supply components 212 which includes intake air moving devices 215, ductwork 218, and supply air dampers 213 which direct cooling air 217 from ductwork 218 into one or more cold aisles 216. In some embodiment, air supply components 212 can include a raised floor plenum, supply air dampers included in one or more portions of the floor element 207 of the computer room, etc. Exhaust air 219 discharged from one or more of the rack computer systems 214 into one or more hot aisles 218 can rise out of the hot aisle into an upper portion of the computer room 201 via one or more gradients, including an air density gradient, pressure gradient, etc.

As shown in FIG. 2B, the roof structure 220 of data center 200 includes various portions 222A-D which each correspond to a proximate one of the regions 210A-D of the computer room 201 beneath that respective roof portion 222. For example roof portion 222A corresponds with room region 210A, roof portion 222B corresponds with room region 210B, etc. Each roof portion 222 includes a separate set of air removal components 221 associated with the corresponding room region 210. For example, the air removal components 221 included in roof portion 222A are associated with room region 210A, such that exhaust air 219 rising through room region 210A is removed from room 201 via some or all of the air removal components 221 in roof portion 222A.

In some embodiments, the air removal components 221 include one or more exhaust air moving devices 226 and one or more exhaust air dampers 223. The exhaust air moving devices 226 each operate to induce an air flow of exhaust air 219 out of the computer room 201 as air flow 228. The exhaust air moving devices 226 can be adjustably controlled to adjustably control the flow rate of exhaust air 219, 228 out of the computer room 201.

In some embodiments, each set of air supply components 212 included in a computer room region 210, and each set of air removal components 221 included in a roof portion 222 corresponding to that room region 210, are included in a common air handling system associated with the particular room region 210. As a result, computer room 201 can include four separate air handling systems which are each associated with a separate particular region 210 of the room 201. Each separate air handling system, including the various components 212, 221 included therein, can be controllably adjusted independently of other air handling systems of other regions of the computer room 201.

In some embodiments, the computer room 201 is an enclosure space in a facility that is separate from a data center. For example, computer room 201, with regions 210A-D can be an enclosure space that is separate from a computer room, where rack computer systems 214 are absent and separate sets of air supply components and air removal components in each region 210 provide air circulation through the respective region 210 of the enclosure space 201. In some embodiments, one or more portions of the data center 200 is included in the data center 100 illustrated above with reference to FIG. 1. For example, computer room 201 can be included in computer room 102 of FIG. 1.

Figure 3:
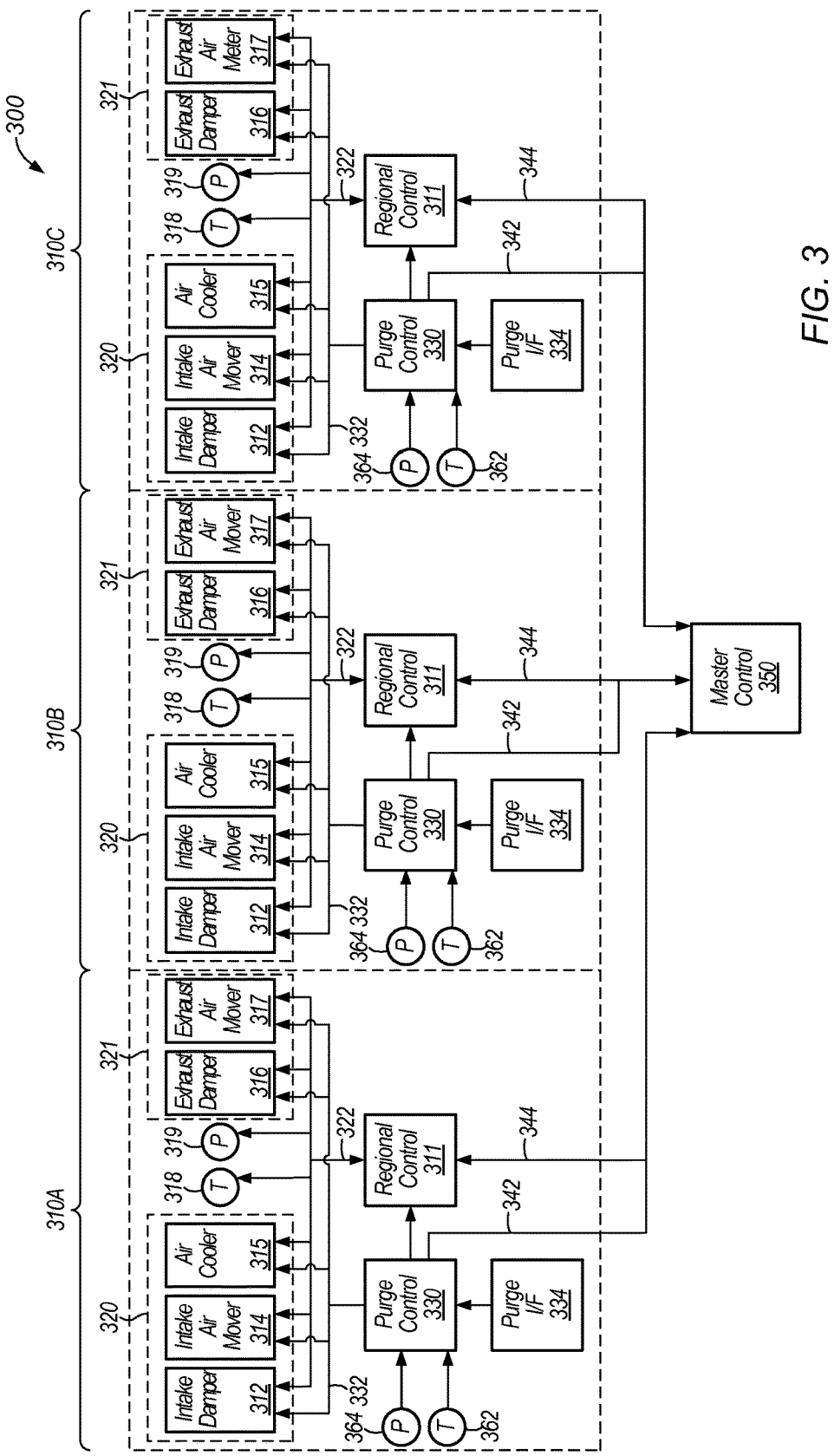
FIG. 3 is a schematic diagram illustrating a data center that includes multiple computer room regions including separate air handling components and control systems, according to some embodiments.

FIG. 3 is a schematic diagram illustrating a data center that includes multiple computer room regions including separate air handling components and control systems, according to some embodiments.

Data center 300 includes multiple computer room regions 310A-C. Each region 310 includes an air supply subsystem 320 and air removal subsystem 321, each of which include various air handling components. In addition, each region includes a separate air control system 311, also referred to as a regional air control system, regional control system, etc., which adjustably controls various air handling components, via generation of controller output signals which are transmitted to the various components, based at least in part upon sensor data received from sensors 318, 319. In the illustrated embodiment, the regions 310 each include separate sets of temperature sensors 318 and pressure sensors 319. It will be understood that some embodiments of a data center include various environmental sensors in a region which measure various conditions of the region of the data center.

Each region includes a separate regional air control system 311 which is communicatively coupled to the various air handling components in the air supply subsystem 320 and air removal subsystem 321 of a region 310 via a communication one or more links 322. In addition, control system 311 is coupled to sensors 318-319 via one or more links 322. Control system 311 can receive sensor data from sensors 318-319, where the sensor data indicates one or more measured environmental conditions of an environment of the region 310 in which the sensors 318-319 are located. The control system 311 can generate controller output signals based on the sensor data, where the controller output signals can include various output signals associated with various components in the air supply subsystem 320 and air removal subsystem 321 and include values indicating a commanded operating state of the particular component to which the output signal is transmitted. The values included in an output signal can be one of a range of signal values, between a minimum value and a maximum value associated with the component for which the signal is generated. The minimum value and maximum value of the range can include a full-minimum value associated with a minimum operating state of the component and a full-maximum value associated with a maximum operating state of the component. For example, where air cooler 315 includes a coolant valve which can be adjustably positioned based at least in part upon controller output signals received from control system 311, where the signals include values indicating an operating state of the cooler 315, a full-minimum signal value can indicate a fully-closed position of the coolant valve, such that cooling by cooler 315 is precluded, and a full-maximum signal value can indicate a fully-open position of the coolant value, such that cooling by cooler 315 is maximized based at least in part upon a maximum coolant flow through the cooler 315.

In some embodiments, regional air control system 311 generates separate controller output signals for each of the air handling components 312, 314, 315, 316, 317 based at least in part upon sensor data from sensor 318-319, where the system 311 executes one or more control loop systems to generate controller output signals. The control loop systems can include one or more PID control systems and can include a temperature control loop system and a pressure control loop system, where control system 311 adjusts signal values of controller output signals generated and transmitted to various components in the region 310 of the control system 311 to direct one or more of region environment temperature or pressure to match a predetermined set point value. Such a control process, where controller output signals with adjusted signal values are generated for transmission to various particular air handling components based on sensor data, can be executed continuously, periodically, intermittently, in response to receipt of sensor data, etc.

Each region 310 of the data center 300 includes a separate purge control system 330. Purge control system 330 is communicatively coupled to the various air handling components 312, 314, 315, 316, 317 in the various air supply subsystems 320 and air removal subsystems 321 in the respective region 310 in which the purge control system 330 is located. Purge control system 330, in some embodiments and as shown, is communicatively coupled to the various air handling components and sensors in the region via one or more links 332 which are independent of the link 322 between the components and sensors with the regional air control system 311. In some embodiments, purge control system 330 is communicatively coupled with the components and sensors of the region 310 via the regional air control system 311, where the purge control system can override the control system 311 and generate purge output signals for transmission via link 322 in place of controller output signals generated at control system 311.

As shown, purge control system 330 is communicatively coupled with sensors 362, 364, so that purge control system 330 can monitor environmental conditions in the region 310 in which the purge control system 330 is located. The purge control system 330 can monitor regional environmental conditions and can determine whether to initiate a purge of the region 310 based at least in part upon the environmental data. For example, the control system 330 can determined whether to initiate a purge based at least in part upon a determination of whether one or more of the measured environmental conditions, including regional temperature, regional static pressure, etc., exceeds one or more threshold values.

In some embodiments, purge control system 330 is operated based at least in part upon user-initiated commands to the system 330. For example, as shown in the illustrated embodiment, each purge control system 330 in each region is linked to a separate manual purge control interface 334, which can include one or more of a button, switch, etc. which an operator can interact with to provide a user command to purge control system 330 to initiate a purge of the region 310 in which the purge control system 330 is located.

In some embodiments, purge control system 330 commands air handling components via generating output signals for transmission to certain air handling component which, when received by those components, are executed by those components to operate the respective components at a particular operating state. Such a particular operating state can include a maximum operating state. Output signals generated by a purge control system can include a purge control signal which is transmitted to air handling components independently of the link 322 between the components and the regional air control system. The purge control signal can include a command to a receiving component to ignore controller output signals from a control system 311. In some embodiments, a purge control signal can be generated for transmission from purge control system 330 to regional air control system 311, where the purge control signal commands control system 311 to cease transmission of controller output signals via link 322.

In some embodiments, purge control system 330 initiates a purge "re-set" upon determining that a purge is to be ended. Such a re-set can include terminating control of the various air handling components in a region 310 by a purge control system 330, resuming control of the components by a regional air control systems 311 of the region 310, etc. Such a determination may be based at least in part upon monitoring sensor data from sensors 362, 364 and determining that one or more environmental conditions, including temperature, static pressure, etc., have crossed one or more threshold values. In some embodiments, such a determination is based at least in part upon receiving a user-initiated re-set command via interface 334. Purge control system 330 can response to such a determination, in some embodiments, by ceasing to generate purge control signals. In some embodiments, purge control system responds to such a determination by generating re-set signals which are transmitted to various components, control systems, etc. For example, purge control system 330 may transmit re-set signals to air handling components to which the system 330 had previously commanded to operate in a purge state, where the re-set signals include commands to execute controller output signals from control system 311. In another example, purge control system 330 transmits a re-set signal to control system 311, where the re-set signal commands control system 311 to resume transmission of controller output signals.

In some embodiments, each of the regional control system 311 and purge control system 330 in a particular region 310A-C of the data center generates output signals to control air handling components associated with that particular region 310 and independently of air handling components in other regions 310 of the data center. In the illustrated embodiment, control system 311 in region 310A controls air handling components 312, 314, 315, 316, 317 of region 310A independently of the air handling components of regions 310B-C.

In some embodiments, regional air control systems in some regions of a data center are commanded to control air handling components of those certain regions in a certain state, based at least in part upon an environment of another one of the regions being purged. The regional control systems of each region may control air handling components of the respective region based at least in part upon receiving a purge state signal which indicates that at least one other region is presently being purged. The regional control systems may re-set control of the components based at least in part upon receiving a re-set signal indicating that all purging regions have ceased being purged.

In the illustrated embodiment, each purge control system 330 and regional air control system 311 in each region 310A-C is communicatively coupled to a master control system 350 via respective links 342, 344. In some embodiments, communicative coupling of a purge control system with elements is via hardwiring. Such a master control system 350, which can include a building management system (BMS), can monitor various environmental conditions, air handling component operations, control system operations, etc. in the data center 300.

In some embodiments, a master control system 350, based at least in part upon receiving a purge signal indicating that at least one region of the data center 300 is being purged, generates purge state signals to various air control systems 311 in the data center 300 to command the control systems 311 to operate air handling components linked to the respective control systems 311 in a certain state. The "certain state" can be referred to as a "resiliency state", where the control system 311 in a region controls the air handling components in the region to mitigate disturbances associated with the purge in the other separate region. For example, as shown in FIG. 2, multiple regions may be located in a single computer room, and a purge may be initiated in one region and not other regions of the computer room. The purge in one region may affect environmental conditions in other regions of the computer room, including other regions not being purged. For example, a purge in one region may result in a sudden drop in static pressure and temperature in adjacent regions of the computer room. A regional air control system of a non-purging region proximate to a purging region may respond to sensor data indicating such disturbances in the local regional environment by adjusting controller output signal values to attempt to compensate for the disturbances. Rather than compensating for the disturbance, such compensation may exacerbate the disturbance.

In some embodiments, upon receiving a purge state signal, a regional air control system adjustably controls one or more air handling components in the region in a resiliency state, where the operating states of the components are limited so that the components operate at a static state. For example, the control system may adjustably control an air moving device in a region to operate at a fixed speed, so that the induced flow rate of air is fixed at a certain flow rate. Such adjustable control can include limiting the range of values of generated controller output signals by changing the maximum signal value and minimum signal value of the range, so that controller output signals are limited to including signal values within a limited range. Such limiting of signal value range can mitigate wide swings in operating state by air handling components, which can mitigate environmental disturbances in the region caused by the regional air control system attempting to compensate for disturbances caused by a purging of another separate region.

In some embodiments, limiting a controller output signal value range of controller output signals for one or more air handling components includes setting the maximum signal value and the minimum signal value to a common value, so that the controller output signals for that component are limited to having a single value. As a result, the component for which the signals are generated will be controlled to operate in a static mode. The single value can be a value of a controller output signal that was generated prior to the regional air control system receiving a purge notification signal, purge state signal, etc. In some embodiments, the single value is a value of the last, or most recent, controller output signal that was generated prior to the regional air control system receiving a purge state signal.

In some embodiments, upon receiving a re-set signal indicating that other regions in the data center, computer room, etc. are no longer being purged, a regional air control system can release the various air handling components of the region from operating in a certain state. For example, where the control system responds to a purge state signal by limiting the output signal value range for one or more various air handling components, the control system can respond to a re-set signal by expanding the signal value range. The range can be expanded to a full range of signal values. For example, the maximum signal value of the range can be increased to a full-maximum value which is associated with commanding an air handling component to operate at a maximum operating state, and the minimum signal value of the range can be decreased to a full-minimum value which is associated with commanding the air handling component to operate at a minimum operating state. Such expansion of the range can occur instantaneously, gradually over time elapsed from the determination that the purging in other regions is ended, etc.

In some embodiments, data center 300 is a facility that is separate from a data center, and regions 310A-C are regions of one or more enclosure spaces that are separate from one or more computer rooms. In some embodiments, one or more portions of the data center 300 is included in the data center 100 illustrated above with reference to FIG. 1. In some embodiments, one or more of the control systems 311, 330, 350 is at least partially implemented by one or more computer systems, including a computer system as illustrated below in FIG. 9.

Figure 4:
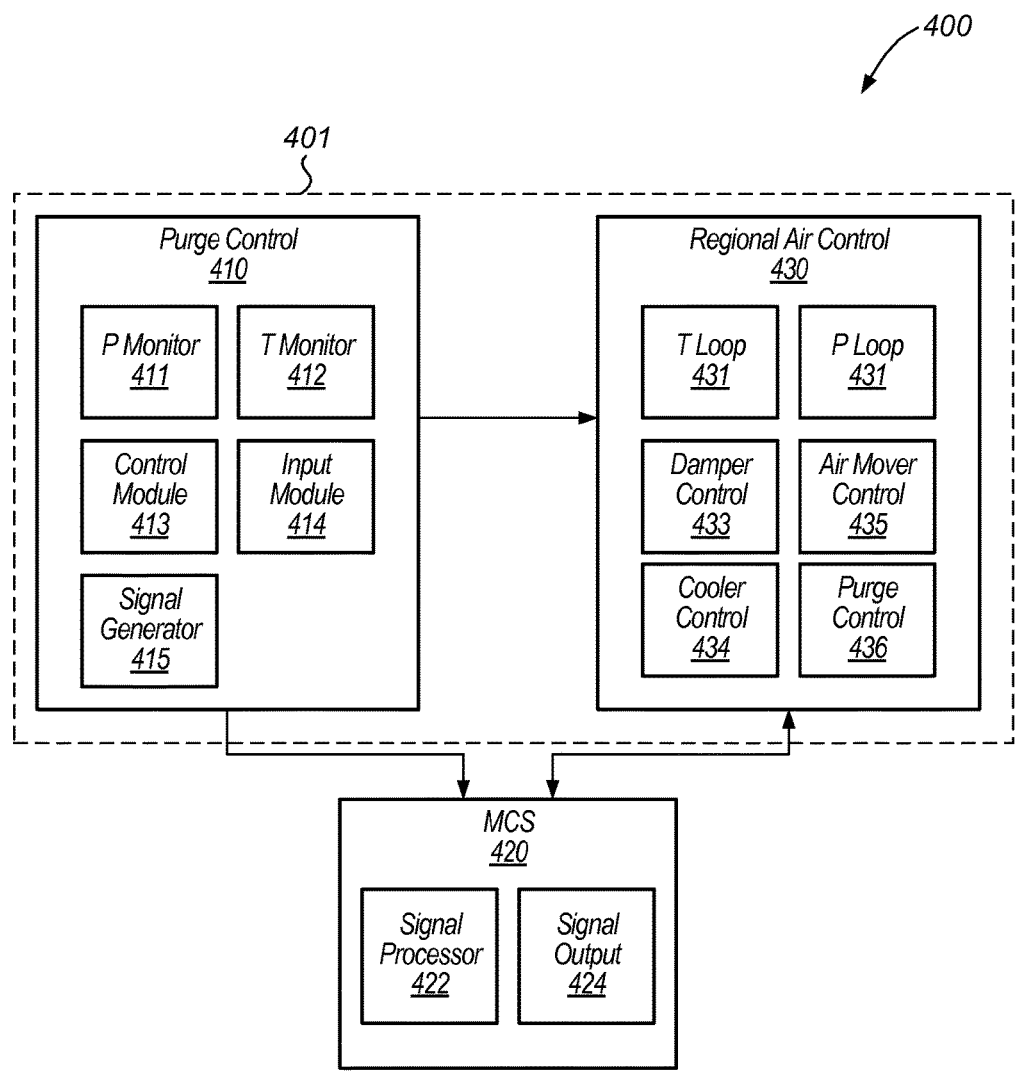
FIG. 4 is a schematic diagram illustrating a data center that includes a master control system and a purge control system and regional control system, according to some embodiments.

FIG. 4 is a schematic diagram illustrating a data center that includes a master control system and a purge control system and regional control system, according to some embodiments.

Data center 400 includes a region 401 and a master control system 420. The region 401 includes a regional air control system 430 and a purge control system 410, both of which are communicatively coupled to the master control system 420.

Regional air control system 430 includes a temperature control loop system 431 and a pressure control loop system 432. The two systems 431, 432 include respective temperature control loops and pressure control loops. Each control loop system processes relevant sensor data and generates a controller output signal having a particular value determined based at least in part upon the sensor data. For example, system 431 processes temperature sensor data to determine a controller output signal value determined based on the temperature. The control loop systems 431, 432 can be PID control systems which adjust the value of controller output signals to direct the measured environmental conditions indicated in the received sensor data towards one or more various set point values. Each control loop system 431, 432 can determine an output signal value, each of which is generated for a particular air handling component in region 401. For example, the systems 431, 432 may determine output signal values for controlling an exhaust air moving device in region 401, separate output signal values for controlling an air cooling system in region 401, etc.

As shown regional air control system 430 includes separate control modules which generate controller output signals for separate air handling components in region 401. The modules can process signal values determined by one or more of systems 431, 432 to generate one or more controller output signals for transmission to one or more air handling components to control those components.

Damper control module 433 generates controller output signals to adjustably control one or more dampers in region 401. Such dampers can include one or more intake air dampers, supply air dampers, and exhaust air dampers, as shown in at least FIG. 1. Damper control module 433 can generate controller output signals which include one or more values which indicate a commanded operating state of the dampers to which the signals are transmitted, so that the signals are executed by the dampers to operate the dampers at the indicated operating state. Such execution can include an actuator of one or more dampers positioning the damper to one or more positions associated with the indicated operating state of a received controller output signal, so that the cross-sectional flow area of the damper is adjustably controlled. Such adjustable control of flow area can adjustably control a flow rate of air through the damper.

Cooler control module 434 generates controller output signals to adjustably control one or more air cooling systems, also referred to herein interchangeably as "coolers", in region 401. Such coolers can include one or more mechanical cooling systems, evaporative cooling systems, free-cooling systems, etc. Cooler control module 434 can generate controller output signals which include one or more values which indicate a commanded operating state of the coolers to which the signals are transmitted, so that the signals are executed by the dampers to operate the dampers at the indicated operating state. Such execution can include a coolant circulation value of one or more coolers adjustably positioning to one or more positions associated with the indicated operating state of a received controller output signal, so that the coolant flow through the cooler is adjustably controlled. Such adjustable control of coolant flow can adjustably control cooling of air, including ambient air, flowing through the cooler, as shown in FIG. 1, thereby controlling the temperature of the cooling air supplied to a computer room in the data center.

Air moving device control module 435 generates controller output signals to adjustably control one or more air moving devices in region 401. Such air moving devices can include one or more intake air moving devices, exhaust air moving devices, etc. Air moving device control module 435 can generate controller output signals which include one or more values which indicate a commanded operating state of the air moving devices to which the signals are transmitted, so that the signals are executed by the air moving devices to operate the air moving devices at the indicated operating state. Such execution can include a variable-frequency drive motor of an air moving device adjustably operating at a particular speed associated with the indicated operating state of a received controller output signal, so that the air flow rate induced by the air moving devices is adjustably controlled.

Control system 430 includes a purge control module 436 which controls operation of modules 433-435 based at least in part upon a determination that a purge is initiated in at least one region of data center 400, which can include one or more regions separate from region 401. The purge control module 436 can process purge notification signals received at the control system 430 to control modules 433-435 to adjustably control various air handling components in region 401 in a resiliency state. As noted above, such control of modules 433-435 can include limiting the range of values of controller output signals generated by modules 433-435. Where the range is limited, signal values determined by systems 431-432 which exceed the maximum or minimum values of the limited range result in generated controller output signals with values at the proximate one of the minimum or maximum value to the determined value. In some embodiments, as noted above, module 436 may limit the range of output signal values to a single signal value which matches a value of a controller output signal generated prior to the module 436 determining, based at least in part upon a received purge state signal, that a purge is initiated in a region of data center 400. Such limiting can include setting the maximum signal value range value, and the minimum signal value range value, for output signals for a particular air handling component, to both equal a value of the last-generated controller output signal for that particular air handling component. As a result, during a purge of a region of data center 400, purge control module 436 can control modules 433-435 of a control system 430 of a region to operate various air handling components in the region 401 at a static mode.

In response to receiving a re-set signal, which indicates that no regions in data center 400 are being purged, purge control module 436 can expand the output signal value range for one or more of modules 433-435, including the modules for which module 436 limited the output signal value range. Expanding the output signal value range for a module 433-435 can include increasing the maximum value, and decreasing the minimum signal value, to match the full-maximum and full-minimum values for the respective air handling component controlled by that module 433-435.

In some embodiments, expanding the value range may be implemented gradually over time. A maximum and minimum value for an output signal value range for controller output signals to be generated for transmission to one or more air handling component can be respectively increased and decreased from a common value to the full-maximum and full-minimum values. For example, the maximum and minimum values can both be changed by respective amounts at a common time interval. The magnitude of change of the minimum and maximum values, rate of change, etc., can be a proportion of the difference between the full-maximum value and common last-known output signal value, difference between the full-minimum value and common last-known output signal value, difference between the full-maximum value and full-minimum value, etc. For example, each of the maximum and minimum values may be changed, in increments equal to 5% of the full range between the full-minimum and full-maximum values, every 10 seconds until the present minimum values and maximum values respectively match the full-minimum and full-maximum values, etc.

In some embodiments, expansion of the value range of controller output signals is implemented at a linear rate with respect to elapsed time from the determination that purging has ceased in the data center. In some embodiments, the expansion is implemented according to a relationship between a change in signal value range and elapsed time from the determination that purging has ceased. Such a relationship can be one or more of linear, geometric, exponential, etc.

Data center 400 includes a purge control system 410 which initiates and re-sets purges in region 401. Purge control system 410 includes pressure monitor module 411 and temperature monitor module 412 which monitor environmental conditions in region 401 based at least in part upon sensor data from environmental sensors in region 401. For example, pressure module 411 can monitor the static pressure in region 401 based at least in part upon pressure sensor data from a pressure sensor in region 401. Temperature module 412 can monitor the temperature in region 401 based at least in parts upon temperature sensor data from a temperature sensor in region 401. Such monitoring by a module 411, 412 can include comparing a measured environmental condition in the region 401 with one or more predetermined threshold values. For example, pressure monitor module 411 may compare a static pressure of the region 401, indicated by sensor data from a pressure sensor in region 401, with one or more various threshold pressure values, including a low-temperature threshold, high-temperature threshold, etc. In another example, temperature monitor module 412 may compare a temperature of the region 401, indicated by sensor data from a temperature sensor in region 401, with one or more various threshold temperature values, including a high-temperature threshold, low-temperature threshold, etc.

Purge control system 410 includes input module 414 which can receive and process user-initiated commands to determine whether a user has commanded initiation or ceasing of purging of region 410. Purge control module 413 determines whether to initiate or cease a purging of region 401, based at least in part upon determinations made by one or more of modules 411-412, 414. For example, module 413 may determine that, based at least in part upon a determination at one or more of modules 411-412 that one or more environmental conditions in region 401 exceed one or more thresholds, that a purge of region 401 is to be initiated. In another example, module 413 may determine that a purge of region 401 is to be initiated based at least in part upon module 414 receiving and processing a user-initiated command to initiate a purge of region 401.

Purge control module 413 can determine, based at least in part upon a determination at one or more of modules 411-412 that one or more environmental conditions in region 401 have crossed one or more thresholds, including falling below or above certain threshold values, that a purge of region 401 is to be ceased. In another example, module 413 may determine that a purge of region 401 is to be ceased based at least in part upon module 414 receiving and processing a user-initiated command to re-set a purge of region 401.

Control module 413 can, in some embodiments, generate various controller output signals to control various air handling components in region 401 to purge the region 401. Such various controller output signals can include output signals which command the various components to operate at a purge state, which can include operating at one or more of a maximum operating state, minimum operating state, etc. Controller output signals can include commands to air handling components to ignore output signals generated by control system 430. Such controller output signals generated by module 413 can be transmitted to the air handling components via communication pathways, also referred to herein as "links", which are independently of the pathways between the air handling components and the control system 430, so that purge control system 410 can generate signals to the air handling components which bypass the control system 430.

Purge control system 410 includes a signal module 415 which generates notification signals based at least in part upon control module 413 controlling air handling components in region 401 to initiate or cease purging of region 401. Such signals may be transmitted to one or more of control system 430, a master control system, other control systems of other regions of data center 400, etc. For example, in response to control module 413 generating control signals to initiate or cease purging region 401, module 415 can generate a notification signal which is transmitted to control system 430. Where the notification signal is transmitted based on region 401 being purged, the signal to control system 430 can command the control system 430 to cease generating output signals as modules 435, limit output signal value ranges, etc. Where the notification signal is transmitted based on region 401 ceasing to be purged, the signal to control system 430 can command the control system 430 to resume generating output signals as modules 435, expand output signal value ranges, etc.

In another example, module 415 can generate a notification signal which is transmitted to master control system 420 to notify the system 420 of the initiation or ceasing of purging of region 401.

Data center 400 includes a master control system 420, which can include a BMS and can monitor various regions of data center 400 to determine whether one or more regions is being purged. Master control system can respond to a determination that one or more regions of data center 400 are being purged by generating notification signals to various control systems of other regions of the data center 400.

The illustrated master control system 420 includes a signal processor module 422 which processes signals received at master control system 420 to determine which regions, if any, of data center 400 are being purged, are ceased being purged, etc. For example, based at least in part upon a purge notification signal being received at master control system 420 from purge control system 410 of region 401, signal processor module 422 may determine that a purge of region 401 has been initiated. In another example, based at least in part upon a re-set notification signal being received at mater control system 420 from the purge control system 410 of region 401, signal processor module 422 may determine that a purge of region 401 has ceased.

The illustrated master control system 420 includes a signal output module 424, which generates various notification signals which are transmitted to various regional air control systems 430 of various regions 401 of data center 400, based at least in part upon determinations made at signal processor module 422. For example, where module 422 determines that one or more regions 401 of data center 400 have initiated a purge, module 424 can generate purge state signals which are transmitted to control systems 430 of various regions of the data center 400 to notify the control systems of the purge. The purge control modules 426 of the various control systems 430 can respond to receiving the purge state signal by controlling various modules 433-435 to control various air handling components in the respective regions in which the control systems 430 are included in a resiliency state. In some embodiments, signals generated at module 424 are transmitted to all control systems 430 in the data center 400, including a control system 430 in a region 401 which is being purged.

In another example, where module 422 determines that one or more regions 401 has ceased being purged, module 424 can generate re-set notification signals which are transmitted to control systems 430 of various regions of the data center 400 to notify the control systems of the re-set. The purge control modules 426 of the various control systems 430 can respond to receiving the re-set notification signal by controlling various modules 433-435 to end resiliency state operation of the various air handling components in the respective regions in which the control systems 430. In some embodiments, module 424 generates re-set notification signals upon a determination that all of the purging regions 401 in data center 400 have ceased purging, such that none of the regions in data center 400 are being purged.

In some embodiments, data center 400 is a facility that is separate from a data center, and region 401 is a region of one or more enclosure spaces that are separate from one or more computer rooms. In some embodiments, one or more portions of the data center 400 is included in the data center 100 illustrated above with reference to FIG. 1. In some embodiments, one or more of the control systems 410, 420, 430 is at least partially implemented by one or more computer systems, including a computer system as illustrated below in FIG. 9.

Figure 5:
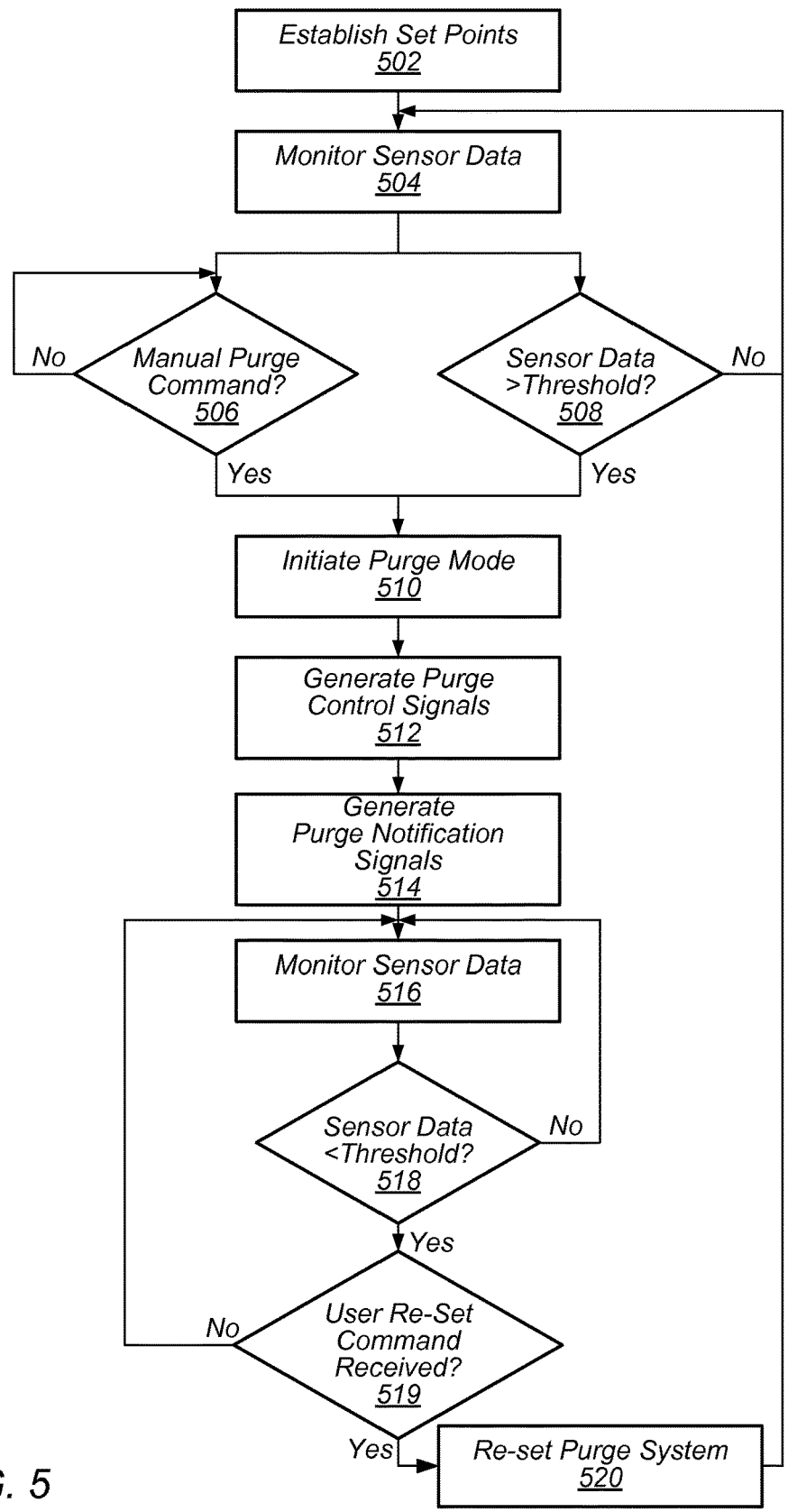
FIG. 5 illustrates managing one or more purges of one or more computer room environments, according to some embodiments.

FIG. 5 illustrates managing one or more purges of one or more computer room environments, according to some embodiments. Such managing, in some embodiments, is implemented by one or more various control systems in a data center, including one or more purge control systems, regional air control systems, etc. of one or more regions of a data center; a master control system of a data center; etc. Such managing, in some embodiments, is implemented by one or more various control systems in an enclosure space of a facility that is separate from a computer room of a data center, including one or more purge control systems, regional air control systems, etc. of one or more regions of an enclosure space; a master control system of a facility including an enclosure space; etc. Such control systems can include one or more of the control systems illustrated in FIG. 1-4 and can be at least partially implemented by one or more computer systems, including a computer system as illustrated below in FIG. 9.

At 502, one or more set point values for determining whether to initiate a purge of a computer room region are established. The set point values can be one or more threshold values characterizing one or more various threshold environmental conditions, where a purge is to be initiated where a measured environmental condition exceeds one or more threshold values for that particular environmental condition. Such environmental conditions can include a temperature of an environment of the region, a static pressure of the environment, etc. For example, multiple set point values for temperature of the region may be established, including a low-temperature set point value and a high-temperature set point value, where the high temperature set point value is greater than the low-temperature set point value. Set point values may be established based at least in part upon threshold environmental conditions, beyond which various components in the computer room may incur damage. For example, a high-pressure set point value may be established based at least in part upon a highest amount of pressure, relative to an ambient pressure, which can be maintained in a computer room without imposing a risk of damage to at least some portion of the data center due to overpressure of the computer room.

At 504, one or more environmental conditions of the region are monitored to determine if one or more of the environmental conditions exceed one or more of the established set point values. The environmental conditions can be monitored via receiving and sensor data from various environmental sensors which are located in the region, where the sensor data indicate one or more environmental conditions, of the region which are measured by the various sensors.

At 506, a determination is made regarding whether a user-initiated command to purge the region is received. Such a user-initiated command can be received based at least in part upon an operator interacting with a manual purge interface, which can include one or more buttons, switches, graphical display interfaces, etc. with which an operator can interact to initiate the purge command. Upon receiving an operator interaction, the interface can generate a signal that indicates the user-initiated command. Upon receipt of such a signal, the signal can be processed to determine that the user-initiated command is received.

At 508, a determination is made regarding whether the monitored environmental conditions, indicated by the received sensor data, indicate that a purge is to be initiated in the region. Such a determination can be made based at least in part upon a determination regarding whether one or more of the environmental conditions of the region exceed one or more of the established set point values, including one or more threshold values. If one or more environmental conditions of an environment of a region, including present temperature, present static pressure, etc. is determined to exceed one or more established set point values for that respective condition, a determination may be made that a purge of the region is to be initiated.

At 510, based at least in part upon one or more of receiving a user-initiated command to purge the region, a determination that the monitored environmental conditions indicate that a purge is to be initiated in the region, etc. a purge control system initiates a purge operating mode of the purge control system. At 512, one or more various purge control signals are generated for transmission to various particular air handling components of the air handling system associated with the region. A purge control signal can include one or more controller output signals which, when received at a particular air handling component, are executed by that component to operate the component in a particular operating state to at least partially purge the region. The particular operating state, which can be referred to as a "purge state", may be a maximum operating state of the component, as described further above. Some purge control signals can be generated for transmission to various air handling components, including exhaust air moving devices, exhaust air dampers, intake air moving devices, air cooling systems, intake air dampers, etc., which command those various components to operate in a purge state, where such a command can include a command to various components to each operate in a maximum operating state. As a result, a purge control signal can include a controller output signal with a value that corresponds to a maximum output signal value for one or more various air handling components.

In some embodiments, a purge control signal includes one or more commands to various air handling components to ignore controller output signals received from a regional air control system. Such commands can result in overriding controller output signals from regional air control systems while the region is being purged. In some embodiments, purge control signals are transmitted to air handling components via a separate communication pathway from another pathway via which controller output signals from a regional air control system are transmitted to the air handling components. As a result, purge control signals may bypass the communication pathway used by the regional air control system, so that one or more air handling components can receive purge control systems independently of controller output signals from a regional air control system. The air handling components may be configured to preferentially execute purge control commands when they are received, relative to controller output signals from a regional air control system.

At 514, one or more purge notification signals are generated. A purge notification signal can indicate that a region is presently being purged, that a purge has been initiated, etc. A purge notification signal may be transmitted to a master control system to notify the master control system of a purge of one or more particular regions of a computer room in the data center. In some embodiments, a purge notification signal includes one or more commands. For example, a purge notification signal transmitted to a regional air control system can include a command to the regional air control system to cease transmission of generated controller output signals, cease generation of controller output signals, some combination thereof, etc.

At 516, one or more environmental conditions of the region are monitored to determine if one or more of the environmental conditions continue to exceed one or more of the established set point values, determine if one or more of the environmental conditions have crossed one or more various set point values, etc. The environmental conditions can be monitored to determine whether to cease purging of the region.

At 518, a determination is made regarding whether one or more of the environmental conditions of the region no longer exceed one or more of the established set point values, whether one or more environmental conditions have crossed one or more various set point values associated with ending a purge, etc. For example, if one or more environmental conditions of an environment of a region, including present temperature, present static pressure, etc. is determined to fall below one or more established set point values for that respective condition, a determination may be made that a purge of the region is to be ceased.

At 519, a determination is made regarding whether a user-initiated purge re-set command is received. Such a user-initiated command can be received based at least in part upon an operator interacting with a manual purge interface, which can include one or more buttons, switches, graphical display interfaces, etc. with which an operator can interact to initiate the re-set command. Upon receiving an operator interaction, the interface can generate a signal that indicates the user-initiated command. Upon receipt of such a signal, the signal can be processed to determine that the user-initiated command is received.

At 520, based at least in part upon a determination that one or more of the environmental conditions of the region no longer exceed one or more of the established set point values, and that a user-initiated purge re-set command is received, a determination is made to end the purge of the region. As shown by 520, such a determination can include a purge control system initiating a re-set operating mode of the purge control system. Such an initiation can include one or more various re-set control signals being generated for transmission to various particular air handling components of the air handling system associated with the region. A re-set control signal can include one or more controller output signals which, when received at a particular air handling component, are executed by that component to cease operate the component in a purge state. As a result, a re-set control signal can include a controller output signal with a value that corresponds to an average output signal value for one or more various air handling components.

In some embodiments, a re-set control signal includes one or more commands to various air handling components to resume executing controller output signals received from a regional air control system. Such commands can result in air handling components executing controller output signals from regional air control systems, instead of signals from a purge control system.

Setting a purge control system into a re-set mode can include generation of one or more re-set notification signals. A re-set notification signal can indicate that a region has ceased being purged. A re-set notification signal may be transmitted to a master control system to notify the master control system of that one or more regions have ceased being purged. In some embodiments, a re-set notification signal includes one or more commands. For example, a re-set notification signal transmitted to a regional air control system can include a command to the regional air control system to resume transmission of generated controller output signals, resume generation of controller output signals, some combination thereof, etc.

Figure 6:
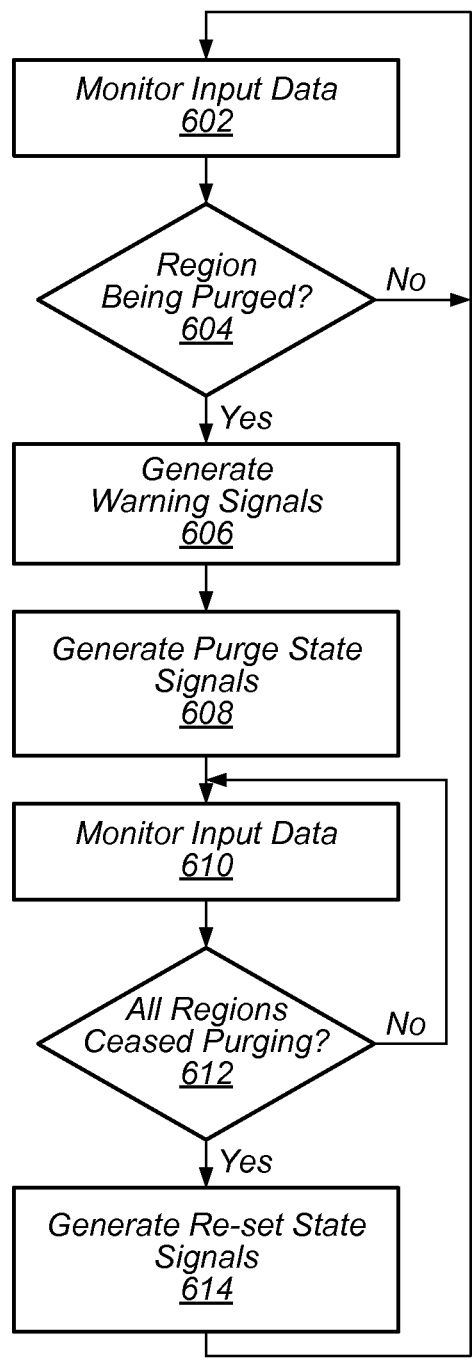
FIG. 6 illustrates managing various control systems in one or more computer room regions, according to some embodiments.

FIG. 6 illustrates managing various control systems in one or more computer room regions, according to some embodiments. Such managing, in some embodiments, is implemented by one or more various control systems in a data center, including one or more purge control systems, regional air control systems, etc. of one or more regions of a data center; a master control system of a data center; etc. Such managing, in some embodiments, is implemented by one or more various control systems in an enclosure space of a facility that is separate from a computer room of a data center, including one or more purge control systems, regional air control systems, etc. of one or more regions of an enclosure space; a master control system of a facility including an enclosure space; etc. Such control systems can include one or more of the control systems illustrated in FIG. 1-4 and can be at least partially implemented by one or more computer systems, including a computer system as illustrated below in FIG. 9.

At 602, various input data associated with various regions in a data center are monitored to determine whether one or more regions are being purged. The monitoring can be implemented at a master control system, building managing system, etc., which receives data from various components associated with various regions in one or more computer rooms in a data center. Input data can include sensor data received from various environmental sensors in various regions, notification signals from one or more regional air control systems, purge control systems, etc. For example, where a data center includes a computer room that itself includes multiple regions, and each of the regions includes one or more regional air control systems and purge control systems, a master control system of the data center can receive notification signals from each of the regional air control systems and purge control systems in the data center. In some embodiments, a notification signal from one or more of a purge control system, regional air control system, etc. in one or more regions includes an indication regarding whether the region in which the respective control system is located is presently being purged.

At 604, a determination is made regarding whether one or more of the regions in a data center is being purged. Such a determination can be made based at least in part upon receiving one or more signals from one or more purge control systems, regional air control systems, etc. from various regions of the data center. For example, based at least in part upon receiving a purge notification signal from one or more of a purge control system, regional air control system, etc. in a particular region, that particular region can be determined to be being purged. The purge notification signal can include an indication that a purge of a region has been initiated.

At 606, one or more warning signals are generated. Warning signals can indicate that one or more regions of the data center are being purged, have initiated a purge, etc. Warning signals can include notification messages transmitted to various operators via a communication network, visual and audio indicators, including lights and sirens, in the data center, etc.

At 608, one or more purge state signals are generated. The signals can be transmitted to various regional air control systems in various regions of the data center and can include an indication that one or more regions in the data center are being purged. In some embodiments, the purge state signals include a command to one or more regional air control systems in one or more regions to control one or more various air handling components in a resiliency state.

At 610 and 612, various input data associated with various regions in a data center are monitored to determine whether one or more regions that were being purged have ceased to be purged. The monitoring can be implemented at a master control system, building managing system, etc., which receives data from various components associated with various regions in one or more computer rooms in a data center. In some embodiments, a notification signal from one or more of a purge control system, regional air control system, etc. in one or more regions includes an indication regarding whether the region in which the respective control system is located is presently being purged.

At 614, one or more re-set state signals are generated. The signals can be transmitted to various regional air control systems in various regions of the data center and can include an indication that one or more regions in the data center have ceased being purged. In some embodiments, re-set state signals are generated based at least in part upon a determination that none of the regions in one or more computer rooms in the data center are being purged. In some embodiments, the re-set state signals include a command to one or more regional air control systems in one or more regions to cease controlling one or more various air handling components in a resiliency state and return to controlling the air handling components in a normal operating state.

Figure 7:
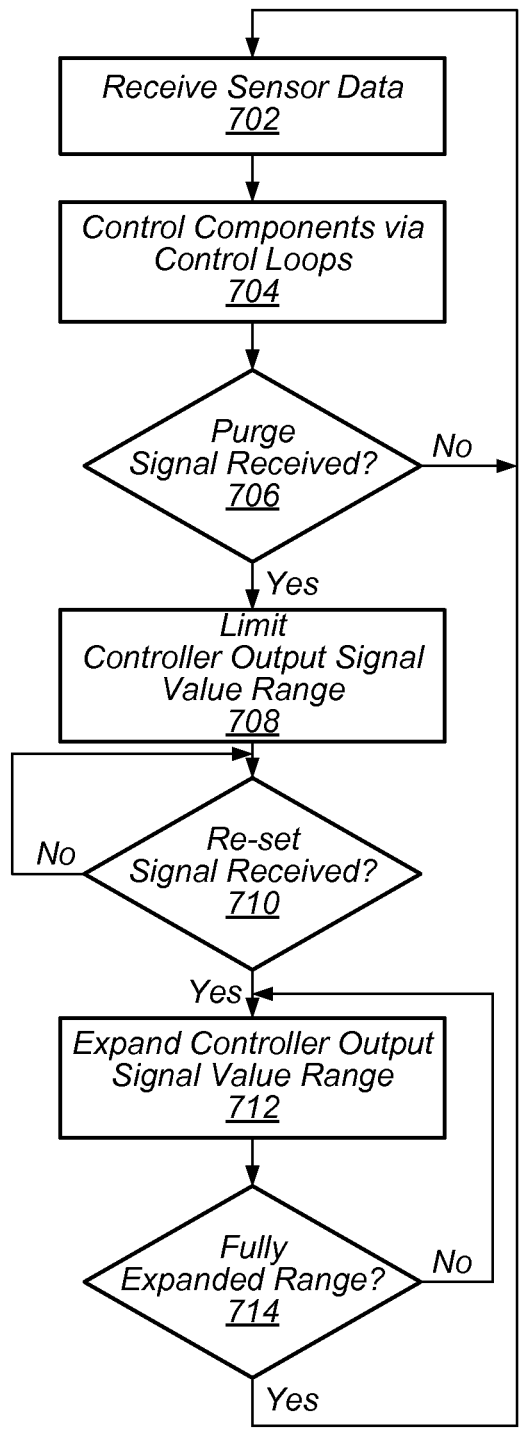
FIG. 7 illustrates managing air handling components concurrently with one or more purges of one or more computer room environments, according to some embodiments.

FIG. 7 illustrates managing air handling components concurrently with one or more purges of one or more computer room environments, according to some embodiments. Such managing, in some embodiments, is implemented by one or more various control systems in a data center, including one or more purge control systems, regional air control systems, etc. of one or more regions of a data center; a master control system of a data center; etc. Such managing, in some embodiments, is implemented by one or more various control systems in an enclosure space of a facility that is separate from a computer room of a data center, including one or more purge control systems, regional air control systems, etc. of one or more regions of an enclosure space; a master control system of a facility including an enclosure space; etc. Such control systems can include one or more of the control systems illustrated in FIG. 1-4 and can be at least partially implemented by one or more computer systems, including a computer system as illustrated below in FIG. 9.

At 702, one or more instances of sensor data are received from one or more environmental sensors located in a computer room. The sensors may be located in a particular region of the computer room. In some embodiments, the environmental sensors include a temperature sensor and a static pressure sensor, so that the sensor data that is received indicates one or more of a temperature of an environment of the region, static pressure of the environment, etc.

At 704, one or more controller output signals are generated, based at least in part upon one or more control loops which process received sensor data to determine output signal values, to adjustably control one or more air handling components of a region. Generating controller output signals can include determining a signal value to be indicated by the controller output signals, where the value indicates a commanded operating state for one or more air handling devices to which the controller output signals are transmitted. The signal value may be determined based at least in part upon the sensor data that is received. For example, the sensor data may be processed, via one or more control loop systems, to determine a signal value indicating an operating state of an air handling system to adjust the environmental conditions of a region toward one or more predetermined set point values, including one or more predetermined set point pressures, temperatures, etc. The control loop systems can include a temperature control loop system, a pressure control loop system, etc. A control loop system can include a PID control system. A signal value may be determined based at least in part upon signal values determined by one or more various control loop systems.

At 706, a determination is made regarding whether one or more of a purge notification signal, purge state signal, etc. is received. Such a signal can include an indication that a region for which the controller output signals are being generated is being purged, an indication that another separate region is being purged, etc.

At 708, where a one or more of a purge notification signal, purge state signal, etc. is received, the output signal values of one or more various control feedback loops may be limited to "freeze" the output from the loops. The output may be "frozen" to control the various air handling components of a region in a resiliency state. Such limiting can include adjusting the range of output signal values to limit the range. Limiting a signal value range can include setting the maximum signal value and the minimum signal value to match a particular common value, so that controller output signals that are generated will have a particular signal value, regardless of what signal values are determined by the various control loop systems. The particular common value can include a signal value of a previously-generated controller output signal. The previously-generated controller output signal can be the last controller output signal generated prior to receipt of a purge notification signal, purge state signal, etc.

At 710, a determination is made regarding whether one or more re-set notification signals, re-set state signals, etc. are received. Such signals can indicate that one or more regions of a computer room, including all regions, are not being purged. Such signals can indicate that regions which were previously being purged have ceased being purged.

At 712, where one or more purge notification signals, purge state signals, etc. are received, various control loop systems which were "frozen" via limiting the output signal value ranges are "released" to return control of the air handling components of the region from a resiliency state to a normal operating state. Such release can include increasing the maximum signal value of the signal value range, and decreasing the minimum signal value of the signal value range, from a common particular signal value to a respective full-maximum value and full-minimum value, so that the controller output signal value range is expanded to encompass a full range for the various air handling components for which controller output signals are generated. In some embodiments, the respective increase of the maximum signal value and decrease of the minimum signal value occurs concurrently. In some embodiments, the respective increase of the maximum signal value and decrease of the minimum signal value occurs gradually over time, in one or more increments over time (i.e., "incrementally"), etc.

At 714, a determination is made regarding whether the control loop systems of the region are fully released, so that the output signal range is fully expanded and the various air handling components controlled via the control loop systems are being controlled in a normal operating state. If not, the output signal range is expanded further.

Figure 8A:
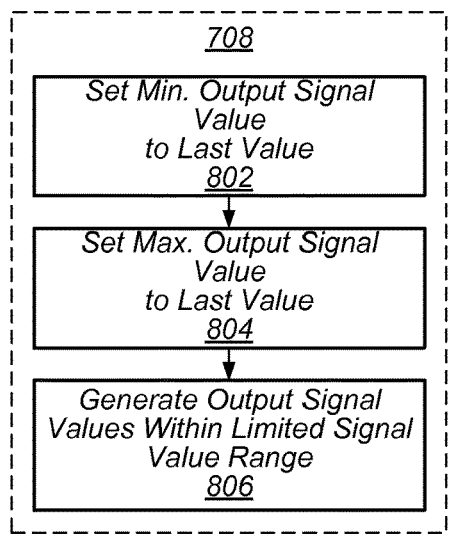
FIG. 8A-B illustrate managing controller output ranges, according to some embodiments.
Figure 8B:
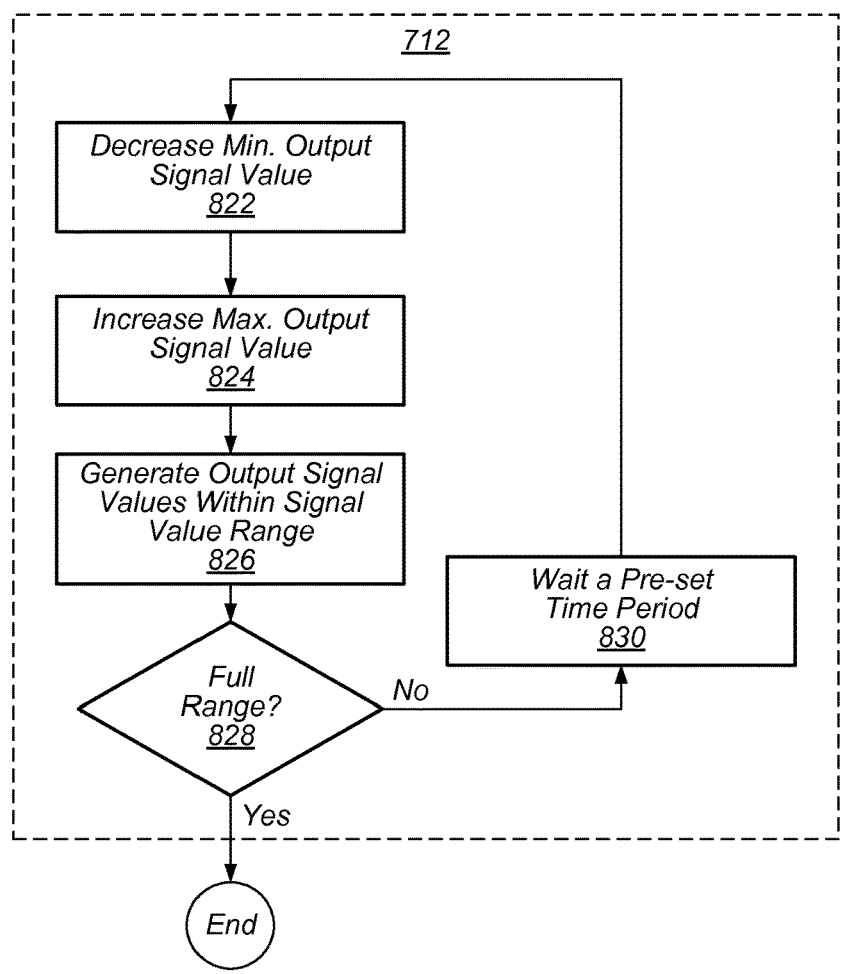

FIG. 8A-B illustrate managing controller output ranges, according to some embodiments. Such managing, in some embodiments, is implemented by one or more various control systems in a data center, including one or more purge control systems, regional air control systems, etc. of one or more regions of a data center; a master control system of a data center; etc. Such managing, in some embodiments, is implemented by one or more various control systems in an enclosure space of a facility that is separate from a computer room of a data center, including one or more purge control systems, regional air control systems, etc. of one or more regions of an enclosure space; a master control system of a facility including an enclosure space; etc. Such control systems can include one or more of the control systems illustrated in FIG. 1-4 and can be at least partially implemented by one or more computer systems, including a computer system as illustrated below in FIG. 9.

FIG. 8A illustrates limiting one or more various control feedback loops to control various air handling units in a resiliency state, as noted in FIG. 7 at 708. Such limiting of a control feedback loop can include adjusting the range of output signal values to limit the range. As a result of limiting the range of output signal values, the operating state of the air handling components can be limited to a limited range, so that the effects of disturbances in the region environment, caused by a purge of one or more regions in the computer room, on the air handling components are limited.

At 802, a minimum output signal value of the controller output signal value range for controller output signals generated for a particular air handling component, out of multiple air handling components in a region, is set from a full-minimum value to be a particular value corresponding to a value of a previously-generated controller output signal. The particular value can be greater than the full-minimum value. The previously-generated controller output signal can be the last controller output signal generated for that particular air handling component prior to receipt of a purge notification signal, purge state signal, etc.

At 804, a maximum output signal value of the controller output signal value range for controller output signals generated for a particular air handling component, out of multiple air handling components in a region, is set from a full-maximum value to be a particular value corresponding to a value of a previously-generated controller output signal. The particular value can be less than the full-maximum value. The particular value to which the maximum output signal value is set can be the same particular value as the value to which the minimum output signal value is set, so that both the minimum and maximum output signal values are a common value. In some embodiments, the minimum and maximum values are different, so that the output signal value range is a limited range, relative to a full range between the full-minimum and full-maximum values.

At 806, one or more controller output signals are generated to control the particular air handling component, where the output signal value is limited to a value within a limited value range that is between the set minimum value and set maximum value, inclusively. Where the set minimum and maximum values are a common value, the generated controller output signals have a common signal value, so that the air handling component is controlled at a fixed operating state corresponding to the common signal value. As a result, the air handling component in a region of a computer room can be operated at a resiliency state during a purge of another region of the computer room, so that disturbances to a region caused by the air handling system attempting to compensate for disturbances caused by the other region being purged are minimized.

FIG. 8B illustrates releasing one or more various control feedback loops to control various air handling units in a normal operating state, as noted in FIG. 7 at 712. Such releasing of a control feedback loop can include adjusting the range of output signal values to expand the range. As a result of expanding the range of output signal values, the operating state of the air handling components can be expanded from a limited range to a full range. The expansion of the signal value range can be gradual, so that the effects overcompensation of a control feedback loop in response to residual disturbances caused by a purge is mitigated.

At 822, a minimum output signal value of the controller output signal value range for controller output signals generated for a particular air handling component, out of multiple air handling components in a region, is decreased from a particular value at which the minimum value is fixed during a resiliency state to a lower minimum value. The lower value can, in some embodiment, be the full-minimum value for the particular air handling component. In some embodiments, the lower value is lower than the particular value by a particular portion of the difference between the particular value and the full-minimum value (e.g., 5%). Such a portion can be referred to as an "increment".

At 824, a maximum output signal value of the controller output signal value range for controller output signals generated for a particular air handling component, out of multiple air handling components in a region, is increased from a particular value at which the maximum value is fixed during a resiliency state to a greater maximum value. The greater value can, in some embodiment, be the full-maximum value for the particular air handling component. In some embodiments, the greater value is greater than the particular value by an increment corresponding to the difference between the particular value and the full-maximum value (e.g., 5%). The increment by which the maximum value is increased can be the same as the increment by which the minimum value is decreased. In some embodiments, the maximum and minimum values are changed by an increment concurrently.

At 826, one or more controller output signals are generated to control the particular air handling component, where the output signal value is limited to a value within a value range that is between the set minimum value and set maximum value, inclusively. Where the changed minimum and maximum values are respective full-minimum and full-maximum values, the particular air handling component is controlled at a normal operating state. Where the changed minimum and maximum values are different from the respective full-minimum and full-maximum values, the particular air handling component is controlled at an intermediate state.

At 828, a determination is made regarding whether the controller output signal value range is expanded to the full range, where the minimum signal value is set at the full-minimum value and the maximum signal value is set at the full-maximum value. If not, at 830, the minimum and maximum values are changed again, by respective increments, after a certain period of elapsed time. The period of elapsed time can be a predetermined set period of time. In some embodiments, the period of elapsed time can change based at least in part upon the difference between the minimum value and the full-minimum value and the difference between the maximum value and the full-maximum value, respectively.

In some embodiments, the increments by which the minimum and maximum values are changed can themselves change based at least in part upon a relationship between the difference between the present minimum value, maximum value, etc. and a period of elapsed time from initiation of release of the control feedback loops at 712. The relationship can be linear, such that one or more of the increments, period of time between increments, etc. changes linearly over time. In some embodiments, the relationship is exponential, static, power-based, etc.

Figure 9:
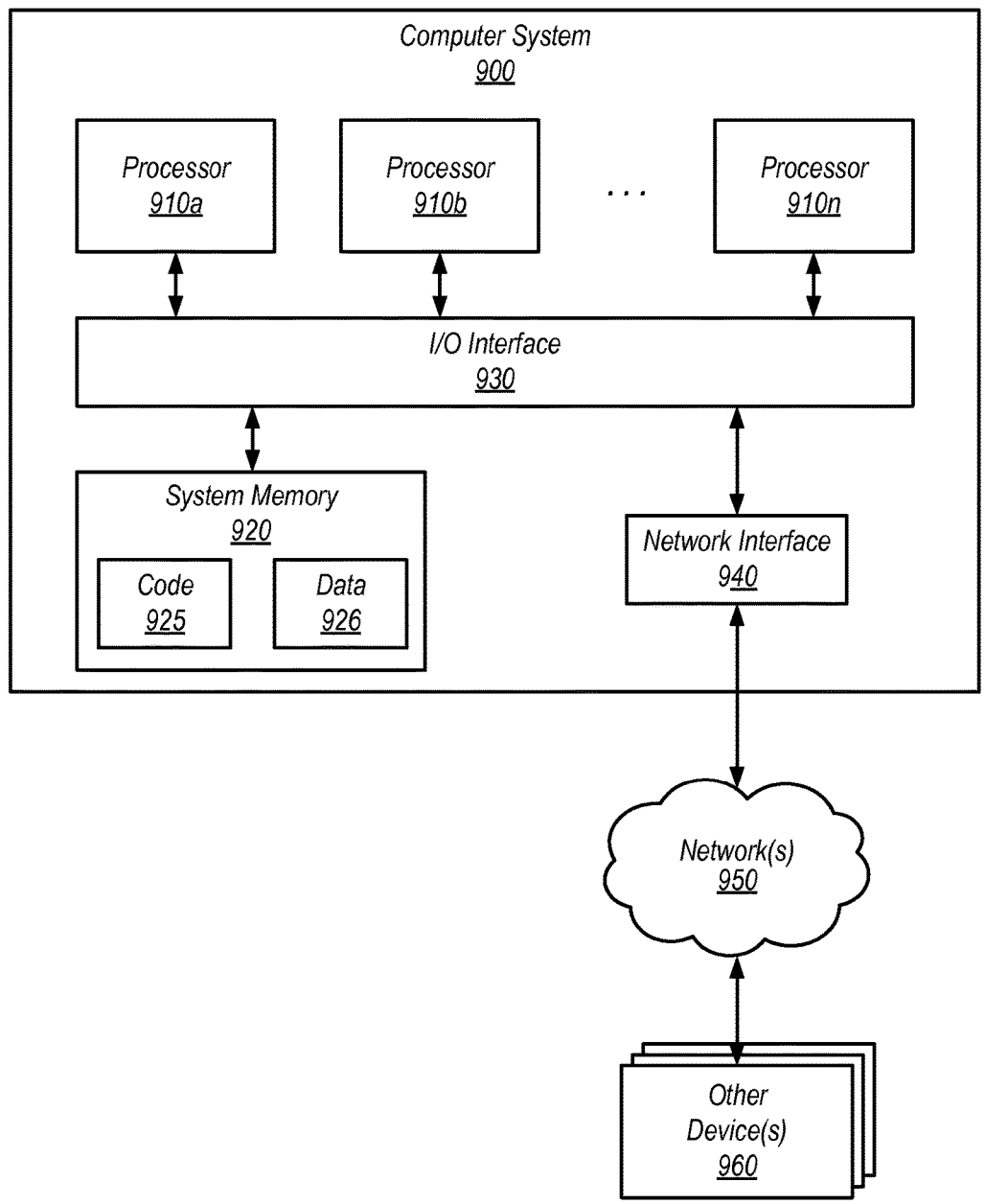
FIG. 9 is a block diagram illustrating an example computer system that may be used in some embodiments.

FIG. 9 is a block diagram illustrating an example computer system that may be used in some embodiments.

In some embodiments, a system that implements a portion or all of one or more of the technologies, including but not limited to one or more portions of the air handling systems, air control systems, purge control systems, one or more components included in the one or more air handling systems, air supply subsystems, air removal subsystems, sensor devices, and various air circulation, cooling, temperature management, and pressure management methods, systems, devices, and apparatuses as described herein, may include a general-purpose computer system that includes or is configured to access one or more computer-accessible media, such as computer system 900 illustrated in FIG. 9. In the illustrated embodiment, computer system 900 includes one or more processors 910 coupled to a system memory 920 via an input/output (I/O) interface 930. In some embodiments, computer system 900 further includes a network interface 940 coupled to I/O interface 930. In some embodiments, computer system 900 is independent of a network interface and can include a physical communication interface that can couple with a communication pathway, including a communication cable, power transmission line, etc. to couple with various external components, systems, etc.

In various embodiments, computer system 900 may be a uniprocessor system including one processor 910, or a multiprocessor system including several processors 910 (e.g., two, four, eight, or another suitable number). Processors 910 may be any suitable processors capable of executing instructions. For example, in various embodiments, processors 910 may be general-purpose or embedded processors implementing any of a variety of instruction set architectures (ISAs), such as the x86, PowerPC, SPARC, or MIPS ISAs, or any other suitable ISA. In multiprocessor systems, each of processors 910 may commonly, but not necessarily, implement the same ISA.

System memory 920 may be configured to store instructions and data accessible by processor(s) 910. In various embodiments, system memory 920 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as one or more portions of the air handling systems, air control systems, purge control systems, one or more components included in the one or more air handling systems, air supply subsystems, air removal subsystems, sensor devices, and various air circulation, cooling, temperature management, and pressure management methods, systems, devices, and apparatuses as described herein, are shown stored within system memory 920 as code 925 and data 926.

In one embodiment, I/O interface 930 may be configured to coordinate I/O traffic between processor 910, system memory 920, and any peripheral devices in the device, including network interface 940 or other peripheral interfaces. In some embodiments, I/O interface 930 may perform any necessary protocol, timing or other data transformations to convert data signals from one component (e.g., system memory 920) into a format suitable for use by another component (e.g., processor 910). In some embodiments, I/O interface 930 may include support for devices attached through various types of peripheral buses, such as a variant of the Peripheral Component Interconnect (PCI) bus standard or the Universal Serial Bus (USB) standard, for example. In some embodiments, the function of I/O interface 930 may be split into two or more separate components, such as a north bridge and a south bridge, for example. Also, in some embodiments some or all of the functionality of I/O interface 930, such as an interface to system memory 920, may be incorporated directly into processor 910.

Network interface 940 may be configured to allow data to be exchanged between computer system 900 and other devices 960 attached to a network or networks 950, such as other computer systems or devices as illustrated in FIGS. 1 through 8, for example. In various embodiments, network interface 940 may support communication via any suitable wired or wireless general data networks, such as types of Ethernet network, for example. Additionally, network interface 940 may support communication via telecommunications/telephony networks such as analog voice networks or digital fiber communications networks, via storage area networks such as Fibre Channel SANs, or via any other suitable type of network and/or protocol.

In some embodiments, system memory 920 may be one embodiment of a computer-accessible medium configured to store program instructions and data for implementing embodiments of air circulation control, purge control, and room air circulation management methods as described above relative to FIGS. 1-8. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 900 via I/O interface 930. A non-transitory computer-accessible storage medium, also referred to as a non-transitory computer-readable storage medium, may also include any volatile or non-volatile media such as RAM (e.g. SDRAM, DDR SDRAM, RDRAM, SRAM, etc.), ROM, etc., that may be included in some embodiments of computer system 900 as system memory 920 or another type of memory. Further, a computer-accessible medium may include transmission media or signals such as electrical, electromagnetic, or digital signals, conveyed via a communication medium such as a network and/or a wireless link, such as may be implemented via network interface 940.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:
1. A data center, comprising:
a computer room comprising a plurality of regions, wherein each region comprises:
a plurality of rack computer systems configured to perform computing operations;
a regional air control system configured to adjustably control air circulation in the region via a control loop system, based at least in part upon at least one measured environmental characteristic of the region, wherein adjustably controlling air circulation in the region comprises:
adjustably controlling one or more air supply components in the region to adjustably control a flow rate of cooling air to the plurality of rack computer systems in the region; and
adjustably controlling one or more air removal components in the region to adjustably control a flow rate of exhaust air, discharged by the plurality of rack computer systems, out of the region;

a regional purge control system configured to bypass the regional air control system and directly command the air supply components and air removal components in the region to purge the environment of the region; and
a master control system configured to, in response to a determination that an environment of at least one of the plurality of regions is presently being purged, command at least one regional air control system of at least one other region which is free from being purged to, for each of the air supply components and air removal components in the at least one other region:
  limit a controller output signal value range of the control loop system, such that a minimum controller output value and a maximum controller output value of the range both match a value of a last controller output generated prior to the determination, and
  incrementally decrease the minimum controller output value and incrementally increase the maximum controller output value, from the last controller output value, to expand the controller output range to a full controller output range for the respective component, in response to a determination that the at least one of the plurality of regions has ceased being purged.

2. The data center of claim 1, wherein:
each regional air control system, for each of the plurality of regions, is configured to, based at least in part upon a determination that the regional air control system has ceased being bypassed and for each of the air supply components and air removal components in the respective region:
  incrementally decrease the minimum controller output value and increase the maximum controller output value, from the last controller output value, to expand the controller output range to a full controller output range for the respective component, in response to a determination that the regional air control system has ceased being bypassed.

3. The data center of claim 1, wherein:
each regional purge control system is configured to, based at least in part upon directly commanding the air supply components and air removal components in the region to purge the environment of the region, generate a purge notification signal which is transmitted to the master control system to enable the determination that an environment of the region comprising the respective regional purge control system is being purged.

4. The data center of claim 1, wherein:
incrementally decreasing the minimum controller output value and increasing the maximum controller output value, from the last controller output value, to expand the controller output range to a full controller output range for the respective component comprises:
  incrementally decreasing the minimum controller output value and increasing the maximum controller output value, based at least in part upon a predetermined relationship between incremental changes in controller output range and an elapse of time from the determination that the at least one of the plurality of regions has ceased being purged.

5. A method, comprising:
performing, by a computer system:
  executing an air control system to generate controller output signals to adjustably control air circulation by at least one air handling component in an enclosure space, based at least in part upon environmental sensor data associated with the enclosure space; and
  limiting a signal value range of generated controller output signals, based at least in part upon a determination that the air handling component is being commanded, via a bypass of the control loop system, to purge the enclosure space,
  wherein limiting the signal value range of generated controller output signals comprises setting both a maximum controller output signal value of the range and a minimum controller output signal value of the range to match a controller output signal value of a previously-generated control output signal, such that subsequently-generated control output signals have values matching the previously-generated controller output signal value.

6. The method of claim 5, comprising, performing, by the computer system:
  expanding the signal value range of generated controller output signals to match a full controller output signal value range, in response to a determination that the air handling component is being commanded to cease purging the enclosure space.

7. The method of claim 6, wherein:
expanding the signal value range of generated controller output signals to match a full controller output range comprises:
  incrementally decreasing the minimum controller output signal value and increasing the maximum controller output signal value to a respective maximum value limit and minimum value limit over a period of elapsed time.

8. The method of claim 7, wherein:
incrementally decreasing the minimum controller output signal value and increasing the maximum controller output signal value to respective maximum value limit and minimum value limit over a period of elapsed time comprises:
  incrementally decreasing the minimum controller output signal value and increasing the maximum controller output signal value based at least in part upon a predetermined relationship between incremental changes in the controller output signal value range and an elapse of time from the determination that the air handling component is being commanded to cease purging the enclosure space.

9. The method of claim 5, wherein:
executing an air control system to generate controller output signals to adjustably control air circulation by at least one air handling component in an enclosure space comprises:
  executing a regional air control system to generate controller output signals to adjustably control air circulation by at least one air handling component in a particular region of a plurality of regions of the enclosure space, based at least in part upon environmental sensor data associated with the particular region; and
the method further comprises performing, by a computer system:
  limiting a signal value range of generated controller output signals to adjustably control air circulation by the at least one air handling component in the particular region, based at least in part upon a determination that another air handling component in a separate region of the plurality of regions is being commanded to purge the other, separate region.

10. The method of claim 9, wherein:
limiting a signal value range of generated controller output signals is based at least in part upon receiving, at the computer system, a purge state signal from a master control system which is communicatively coupled to each of the plurality of regions, wherein the purge state signal indicates that the other air handling component in the separate region is being commanded to purge the other, separate region.

11. The method of claim 5, wherein:
the at least one air handling component in the enclosure space comprises:
an air supply subsystem configured to supply an adjustably controllable flow rate of cooling air to the enclosure space; and
an exhaust air moving device configured to induce an adjustably controllable flow rate of exhaust air out of the enclosure space; and
commanding the air handling component to purge the enclosure space comprises commanding each of the air supply subsystem and the exhaust air moving device to operate at respective maximum operating states, such that a maximum flow rate of cooling air and a maximum flow rate of exhaust air are both induced.

12. A non-transitory computer-readable medium storing a program of instructions that, when executed by a computer system, causes the computer system to:
generate controller output signals to adjustably control air circulation in a computer room, via adjustable control of at least one air handling component in the computer room, based at least in part upon environmental sensor data associated with the computer room; and
limit corresponding signal value ranges of one or more generated controller output signals associated with one or more corresponding regions of the computer room that are free from being purged during a purge of at least one region of the computer room, based at least in part upon a determination that one or more of the at least one air handling component is being commanded to purge the at least one region of the computer room,
wherein limiting the corresponding signal value ranges of one or more generated controller output signals comprises setting both a maximum controller output signal value of the corresponding signal value range and a minimum controller output signal value of the corresponding signal value range to match a corresponding controller output signal value of a previously-generated corresponding control output signal, such that subsequently-generated corresponding control output signals have values matching the previously-generated corresponding controller output signal value.

13. The non-transitory computer-readable medium of claim 12, wherein the program of instructions, when executed by the computer system, causes the computer system to:
expand the corresponding signal value range of corresponding generated controller output signals to match a corresponding full controller output signal value range, in response to a determination that the one or more air handling component is being commanded to cease purging the at least one region of the computer room.

14. The non-transitory computer-readable medium of claim 13, wherein:
expanding the corresponding signal value range of corresponding generated controller output signals to match a corresponding full controller output range comprises:
incrementally decreasing the corresponding minimum controller output signal value and increasing the corresponding maximum controller output signal value to a respective maximum value limit and minimum value limit over a period of elapsed time.

15. The non-transitory computer-readable medium of claim 14, wherein:
incrementally decreasing the corresponding minimum controller output signal value and increasing the corresponding maximum controller output signal value to the respective maximum value limit and minimum value limit over a period of elapsed time comprises:
incrementally decreasing the corresponding minimum controller output signal value and increasing the corresponding maximum controller output signal value based at least in part upon a predetermined relationship between incremental changes in the corresponding controller output signal value range and an elapse of time from the determination that the air handling component is being commanded to cease purging the at least one region of the computer room.

16. The non-transitory computer-readable medium of claim 12, wherein:
generating controller output signals to adjustably control air circulation by at least one air handling component in a computer room comprises:
executing a regional air control system to generate controller output signals to adjustably control air circulation by at least one air handling component in a particular region of a plurality of regions of the computer room, based at least in part upon environmental sensor data associated with the particular region; and
the program of instructions, when executed by the computer system, causes the computer system to:
limit the signal value ranges of one or more generated controller output signals to adjustably control air circulation by the at least one air handling component in the particular region, based at least in part upon a determination that another air handling component in another separate region of the plurality of regions is being commanded to purge that other separate region.

17. The non-transitory computer-readable medium of claim 16, wherein:
limiting a signal value range of generated controller output signals is based at least in part upon receiving, at the computer system, a purge state signal from a master control system, which is communicatively coupled to each of the plurality of regions, wherein the purge state signal indicates that the other air handling component in the separate region is being commanded to purge that other separate region.

18. The non-transitory computer-readable medium of claim 12, wherein:
the at least one air handling component in the computer room comprises:
an air supply subsystem configured to supply an adjustably controllable flow rate of cooling air to the at least one region of the computer room; and
an exhaust air moving device configured to induce an adjustably controllable flow rate of exhaust air out of the at least one region of the computer room; and
commanding the air handling component to purge the at least one region of the computer room comprises commanding each of the air supply subsystem and the exhaust air moving device to operate at respective maximum operating states, such that a maximum flow rate of cooling air and a maximum flow rate of exhaust air are both induced.

\* \* \* \* \*